US008554888B2

(12) United States Patent
Morohashi

(10) Patent No.: US 8,554,888 B2
(45) Date of Patent: Oct. 8, 2013

(54) CONTENT MANAGEMENT SYSTEM FOR SEARCHING FOR AND TRANSMITTING CONTENT

(75) Inventor: Akihiro Morohashi, Tokyo (JP)

(73) Assignee: Sony Corporation, Tokyo (JP)

( * ) Notice: Subject to any disclaimer, the term of this patent is extended or adjusted under 35 U.S.C. 154(b) by 153 days.

(21) Appl. No.: 13/094,562

(22) Filed: Apr. 26, 2011

(65) Prior Publication Data

US 2011/0202630 A1 Aug. 18, 2011

Related U.S. Application Data

(63) Continuation of application No. 11/434,181, filed on May 16, 2006, now abandoned, which is a continuation of application No. 09/665,786, filed on Sep. 20, 2000, now Pat. No. 7,130,251.

(30) Foreign Application Priority Data

Sep. 21, 1999 (JP) ..................................... 11-267135

(51) Int. Cl.
*G06F 15/177* (2006.01)

(52) U.S. Cl.
USPC ............................ 709/222; 709/231; 709/245

(58) Field of Classification Search
None
See application file for complete search history.

(56) References Cited

U.S. PATENT DOCUMENTS

| 5,014,317 | A | | 5/1991 | Kita et al. |
| 5,032,989 | A | * | 7/1991 | Tornetta ........................ 705/313 |
| 5,046,004 | A | | 9/1991 | Tsumura et al. |
| 5,089,885 | A | * | 2/1992 | Clark ............................... 725/93 |
| 5,268,889 | A | | 12/1993 | Furukawa et al. |
| 5,276,866 | A | | 1/1994 | Paolini |
| 5,301,346 | A | * | 4/1994 | Notarianni et al. ........... 700/267 |
| 5,355,302 | A | | 10/1994 | Martin et al. |
| 5,408,686 | A | | 4/1995 | Mankovitz |
| 5,434,618 | A | * | 7/1995 | Hayashi et al. ............ 348/231.2 |
| 5,465,240 | A | | 11/1995 | Mankovitz |
| 5,521,326 | A | | 5/1996 | Sone |
| 5,559,945 | A | | 9/1996 | Beaudet et al. |
| 5,579,233 | A | | 11/1996 | Burns |

(Continued)

FOREIGN PATENT DOCUMENTS

| CA | 2 225 190 | 12/1997 |
| CA | 2 464 102 | 5/2003 |

(Continued)

OTHER PUBLICATIONS

U.S. Appl. No. 13/297,666, filed Nov. 16, 2011, Morohashi.

(Continued)

*Primary Examiner* — Ian N Moore
*Assistant Examiner* — Dung B Huynh
(74) *Attorney, Agent, or Firm* — Oblon, Spivak, McClelland, Maier & Neustadt, L.L.P.

(57) ABSTRACT

A communication system including a first apparatus having a first storage medium, and a second apparatus for transmitting data to the first apparatus. The second apparatus has a second storage medium for storing management information of data to be transferred to the first storage medium, a communicator for communicating data with the first apparatus, an editor capable of editing the management information and a controller for making a control to transfer data stored in the second storage medium to the first storage medium by way of the communicator based on the management information edited by the editor.

63 Claims, 11 Drawing Sheets

(56) References Cited

U.S. PATENT DOCUMENTS

| | | | |
|---|---|---|---|
| 5,583,993 A | 12/1996 | Foster et al. | |
| 5,611,693 A | 3/1997 | Chaya et al. | |
| 5,616,876 A | 4/1997 | Cluts | |
| 5,633,839 A | 5/1997 | Alexander et al. | |
| 5,640,566 A | 6/1997 | Victor et al. | |
| 5,654,516 A | 8/1997 | Tashiro et al. | |
| 5,663,516 A | 9/1997 | Kawashima | |
| 5,666,530 A | 9/1997 | Clark et al. | |
| 5,680,609 A | 10/1997 | Reinhardt | |
| 5,703,795 A * | 12/1997 | Mankovitz | 715/721 |
| 5,710,922 A * | 1/1998 | Alley et al. | 1/1 |
| 5,721,949 A | 2/1998 | Smith et al. | |
| 5,727,202 A | 3/1998 | Kucala | |
| 5,732,216 A | 3/1998 | Logan et al. | |
| 5,739,451 A | 4/1998 | Winksy et al. | |
| 5,751,672 A | 5/1998 | Yankowski | |
| 5,754,306 A * | 5/1998 | Taylor et al. | 358/400 |
| 5,761,519 A | 6/1998 | Wada et al. | |
| 5,771,330 A | 6/1998 | Takano et al. | |
| 5,805,545 A | 9/1998 | Nakamaru et al. | |
| 5,808,224 A | 9/1998 | Kato | |
| 5,824,934 A | 10/1998 | Tsurumi et al. | |
| 5,832,285 A * | 11/1998 | Shimada | 713/323 |
| 5,835,721 A | 11/1998 | Donahue et al. | |
| 5,835,732 A | 11/1998 | Kikinis et al. | |
| 5,835,789 A | 11/1998 | Ueda et al. | |
| 5,841,979 A | 11/1998 | Schulhof et al. | |
| 5,864,868 A | 1/1999 | Contois | |
| 5,884,323 A | 3/1999 | Hawkins et al. | |
| 5,889,223 A | 3/1999 | Matsumoto | |
| 5,889,477 A | 3/1999 | Fastenrath | |
| 5,903,892 A * | 5/1999 | Hoffert et al. | 1/1 |
| 5,915,252 A | 6/1999 | Misheski et al. | |
| 5,918,213 A | 6/1999 | Bernard et al. | |
| 5,918,303 A | 6/1999 | Yamaura et al. | |
| 5,923,757 A | 7/1999 | Hocker et al. | |
| 5,926,624 A | 7/1999 | Katz et al. | |
| 5,930,768 A | 7/1999 | Hooban | |
| 5,974,141 A | 10/1999 | Saito | |
| 5,978,835 A | 11/1999 | Ludwig et al. | |
| 5,983,176 A | 11/1999 | Hoffert et al. | |
| 6,006,274 A | 12/1999 | Hawkins et al. | |
| 6,016,520 A | 1/2000 | Facq et al. | |
| 6,031,565 A | 2/2000 | Getty et al. | |
| 6,031,795 A | 2/2000 | Wehmeyer | |
| 6,041,023 A | 3/2000 | Lakhansingh | |
| 6,052,735 A | 4/2000 | Ulrich et al. | |
| 6,097,557 A | 8/2000 | Inoue et al. | |
| 6,118,450 A | 9/2000 | Proehl et al. | |
| 6,125,369 A | 9/2000 | Wu et al. | |
| 6,154,214 A | 11/2000 | Uyehara et al. | |
| 6,172,948 B1 | 1/2001 | Keller et al. | |
| 6,188,662 B1 | 2/2001 | Maeda et al. | |
| 6,205,448 B1 | 3/2001 | Kruglikov et al. | |
| 6,208,044 B1 | 3/2001 | Viswanadham et al. | |
| 6,216,131 B1 | 4/2001 | Liu et al. | |
| 6,248,945 B1 | 6/2001 | Sasaki | |
| 6,248,946 B1 | 6/2001 | Dwek | |
| 6,269,394 B1 | 7/2001 | Kenner et al. | |
| 6,272,545 B1 * | 8/2001 | Flanagin et al. | 709/228 |
| 6,295,541 B1 | 9/2001 | Bodnar et al. | |
| 6,304,523 B1 | 10/2001 | Jones et al. | |
| 6,331,867 B1 | 12/2001 | Eberhard et al. | |
| 6,335,742 B1 | 1/2002 | Takemoto | |
| 6,336,028 B1 | 1/2002 | Okamoto et al. | |
| 6,341,316 B1 | 1/2002 | Kloba et al. | |
| 6,345,252 B1 | 2/2002 | Beigi et al. | |
| 6,345,256 B1 | 2/2002 | Milsted et al. | |
| 6,351,442 B1 | 2/2002 | Tagawa et al. | |
| 6,351,736 B1 | 2/2002 | Weisberg et al. | |
| 6,377,530 B1 | 4/2002 | Burrows | |
| 6,385,654 B1 | 5/2002 | Tanaka | |
| 6,393,430 B1 | 5/2002 | Van Ryzin | |
| 6,407,752 B1 | 6/2002 | Harnett | |
| 6,408,332 B1 | 6/2002 | Matsumoto et al. | |
| 6,434,103 B1 | 8/2002 | Shitara et al. | |
| 6,446,080 B1 | 9/2002 | Van Ryzin et al. | |
| 6,449,607 B1 | 9/2002 | Tomita et al. | |
| 6,493,758 B1 | 12/2002 | McClain | |
| 6,505,160 B1 | 1/2003 | Levy et al. | |
| 6,523,124 B1 | 2/2003 | Lunsford et al. | |
| 6,556,772 B1 | 4/2003 | Ando et al. | |
| 6,577,735 B1 * | 6/2003 | Bharat | 380/286 |
| 6,587,403 B1 | 7/2003 | Keller et al. | |
| 6,587,404 B1 | 7/2003 | Keller et al. | |
| 6,603,506 B2 | 8/2003 | Ogawa et al. | |
| 6,618,551 B1 | 9/2003 | Tanaka et al. | |
| 6,621,768 B1 | 9/2003 | Keller et al. | |
| 6,636,773 B1 | 10/2003 | Tagawa et al. | |
| 6,636,873 B1 | 10/2003 | Carini et al. | |
| 6,658,496 B1 | 12/2003 | Minakata et al. | |
| 6,665,803 B2 | 12/2003 | Lunsford et al. | |
| 6,668,158 B1 | 12/2003 | Tsutsui et al. | |
| 6,686,958 B1 | 2/2004 | Watanabe et al. | |
| 6,694,200 B1 | 2/2004 | Naim | |
| 6,714,920 B1 | 3/2004 | Arai | |
| 6,718,348 B1 | 4/2004 | Novak et al. | |
| 6,731,312 B2 | 5/2004 | Robbin | |
| 6,784,925 B1 | 8/2004 | Tomat et al. | |
| 6,785,542 B1 | 8/2004 | Blight et al. | |
| 6,794,566 B2 | 9/2004 | Pachet | |
| 6,801,964 B1 | 10/2004 | Mahdavi | |
| 6,850,971 B1 * | 2/2005 | Murakoshi et al. | 709/217 |
| 6,871,009 B1 | 3/2005 | Suzuki | |
| 6,925,513 B1 | 8/2005 | Clark | |
| 6,970,637 B1 | 11/2005 | Yoshida | |
| 6,993,567 B1 | 1/2006 | Yodo et al. | |
| 7,126,770 B1 | 10/2006 | Arai et al. | |
| 7,130,251 B1 * | 10/2006 | Morohashi | 369/47.13 |
| 7,249,106 B1 | 7/2007 | Tanabe et al. | |
| 7,284,033 B2 | 10/2007 | Jhanji | |
| 7,310,676 B2 | 12/2007 | Bourne | |
| 7,617,537 B2 | 11/2009 | Morohashi | |
| 7,685,237 B1 | 3/2010 | Weaver et al. | |
| 7,720,929 B2 | 5/2010 | Morohashi | |
| 2001/0021053 A1 | 9/2001 | Colbourne et al. | |
| 2001/0028785 A1 | 10/2001 | Okada | |
| 2001/0041021 A1 | 11/2001 | Boyle et al. | |
| 2001/0051995 A1 | 12/2001 | Haakma et al. | |
| 2001/0052123 A1 | 12/2001 | Kawai | |
| 2001/0056434 A1 | 12/2001 | Kaplan et al. | |
| 2002/0002413 A1 | 1/2002 | Tokue | |
| 2002/0012900 A1 | 1/2002 | Song | |
| 2002/0013784 A1 | 1/2002 | Swanson | |
| 2002/0026496 A1 | 2/2002 | Boyer et al. | |
| 2002/0046315 A1 | 4/2002 | Miller et al. | |
| 2002/0055934 A1 | 5/2002 | Lipscomb et al. | |
| 2002/0069113 A1 | 6/2002 | Stern | |
| 2002/0116082 A1 | 8/2002 | Gudorf | |
| 2002/0138606 A1 | 9/2002 | Robison | |
| 2002/0161865 A1 | 10/2002 | Nguyen | |
| 2002/0174269 A1 | 11/2002 | Spurgat et al. | |
| 2002/0194260 A1 | 12/2002 | Headley et al. | |
| 2003/0037254 A1 | 2/2003 | Fischer et al. | |
| 2003/0046434 A1 | 3/2003 | Flanagin et al. | |
| 2003/0074457 A1 | 4/2003 | Kluth | |
| 2003/0079038 A1 | 4/2003 | Robbin et al. | |
| 2003/0167318 A1 | 9/2003 | Robbin et al. | |
| 2003/0206723 A1 | 11/2003 | Ando et al. | |
| 2004/0001395 A1 | 1/2004 | Keller et al. | |
| 2004/0001396 A1 | 1/2004 | Keller et al. | |
| 2004/0055446 A1 | 3/2004 | Robbin et al. | |
| 2004/0076086 A1 | 4/2004 | Keller et al. | |
| 2004/0225762 A1 | 11/2004 | Poo | |
| 2005/0076146 A1 | 4/2005 | Murakoshi et al. | |
| 2005/0083870 A1 | 4/2005 | Koga et al. | |
| 2007/0106739 A1 | 5/2007 | Clark et al. | |
| 2008/0154408 A1 | 6/2008 | Morohashi | |
| 2010/0135133 A1 | 6/2010 | Morohashi | |
| 2010/0281140 A1 | 11/2010 | Morohashi | |
| 2010/0281141 A1 | 11/2010 | Morohashi | |

(56) References Cited

U.S. PATENT DOCUMENTS

FOREIGN PATENT DOCUMENTS

| | | |
|---|---|---|
| EP | 0 438 299 | 7/1991 |
| EP | 0 467 208 | 9/1995 |
| EP | 0 803 873 | 10/1997 |
| EP | 0 820 179 | 1/1998 |
| EP | 0 884 871 A1 | 12/1998 |
| EP | 0 898 278 A2 | 2/1999 |
| EP | 0 899 929 | 3/1999 |
| EP | 0 909 089 | 4/1999 |
| EP | 0 917 077 | 5/1999 |
| EP | 0 933 901 A1 | 8/1999 |
| EP | 0 935 248 A2 | 8/1999 |
| EP | 0 982 732 | 3/2000 |
| EP | 1 028 425 | 8/2000 |
| EP | 1 037 180 | 9/2000 |
| EP | 1 098 211 | 5/2001 |
| EP | 1 098 212 | 5/2001 |
| EP | 1 152 397 | 11/2001 |
| EP | 1 154 403 | 11/2001 |
| GB | 2 103 865 | 2/1983 |
| GB | 2 325 766 A | 12/1998 |
| GB | 2 387 001 | 10/2003 |
| JP | 58-17576 | 2/1983 |
| JP | 04-271396 | 9/1992 |
| JP | 06-006495 | 1/1994 |
| JP | 06-150501 | 5/1994 |
| JP | 6-187730 | 7/1994 |
| JP | 07-262757 | 10/1995 |
| JP | 8-180645 | 7/1996 |
| JP | 09-065279 | 3/1997 |
| JP | 09-116860 | 5/1997 |
| JP | 09-149358 | 6/1997 |
| JP | 27-35731 | 1/1998 |
| JP | 10-162553 | 6/1998 |
| JP | 10-164478 | 6/1998 |
| JP | 10-164507 | 6/1998 |
| JP | 10-208385 | 8/1998 |
| JP | 10-276157 | 10/1998 |
| JP | 10-276160 | 10/1998 |
| JP | 11-66706 | 3/1999 |
| JP | 11-110912 | 4/1999 |
| JP | 11-126084 | 5/1999 |
| JP | 11-232775 | 8/1999 |
| JP | 11-232840 | 8/1999 |
| JP | 11-238303 | 8/1999 |
| JP | 11-242686 | 9/1999 |
| JP | 11-242873 | 9/1999 |
| JP | 11-306057 | 11/1999 |
| JP | 2001-076464 | 3/2001 |
| JP | 2001-143443 | 5/2001 |
| JP | 2006-202475 | 8/2006 |
| JP | 2006-221793 | 8/2006 |
| JP | 2007-299519 | 11/2007 |
| WO | WO 95/16950 | 6/1995 |
| WO | WO 99/13416 | 3/1999 |
| WO | WO 99/42996 | 8/1999 |
| WO | WO 99/44202 | 9/1999 |
| WO | WO 99/54870 | 10/1999 |
| WO | WO 00/25154 | 5/2000 |
| WO | WO 01/33569 | 5/2001 |
| WO | WO 01/37257 | 5/2001 |
| WO | WO 01/67753 | 9/2001 |
| WO | WO 02/25610 | 3/2002 |
| WO | WO 03/023786 | 3/2003 |
| WO | WO 03/036541 | 5/2003 |

OTHER PUBLICATIONS

"SDMI Secure Digital Music XP000997330. Initiative," *SDMI Portable Device Specification*, Part 1, Ver. 1.0, Jul. 8, 1999, pp. 1-35, XP000997330.

"Kogata Memory Card de Ongaku Chosakuken wo Mamoru," Nikkei Electronics, vol. 739, Mar. 22, 1999, pp. 49-53.

"Ongaku Haishin Matta Nashi," Nikkei Electronics, vol. 738, Mar. 8, 1999, pp. 87-111.

Miniman, Jared, "Applian Software's Replay Radio and Player v.1.02," pocketnow.com, Product Review (Jul. 31, 2001). Jan. 24, 2006 <http://www.pocketnow.com/index.php?a=portal_detail&t=reviews&id=139>.

Firewire (also known as Sony's iLink or IEEE 1394), Wikipedia (1995). Jan. 24, 2006 <http://en.wikipedia.org/wiki/Firewire>.

De Herrera, Chris, "Microsoft ActiveSync 3.1," Ver. 1.02 (Oct. 13, 2000). Jan. 24, 2006 <http://www.pocketpcfaq.com/wce/activesync3.1.htm>.

Birrell, Andrew, "Personal Jukebox (PJB)," Compaq Systems Research Center and PAAD (Oct. 13, 2000). Jan. 24, 2006 <http://birrell.org/andrew/talks/pjb-overview.ppt>.

Butler, Travis, "Portable MP3: The Nomad Jukebox," Tidbits.com (Jan. 8, 2001). Jan. 24, 2006 <http://db.tidbits.com/getbits.acgi?tbart=06261>.

Butler, Travis, "Archos Jukebox 6000 Challenges Nomad Jukebox," Tidbits.com (Aug. 13, 2001). Jan. 24, 2006 <http://db.tidbits.com/getbits.acgi??tbart=06521>.

Engst, Adam C., "SoundJam Keeps on Jammin'," Tidbits.com (Jun. 19, 2000). Jan 24, 2006 <http://db.tidbits.com/getbits.acgi?tbart=05988>.

Musicmatch, "Musicmatch and Xing Technology Introduce Musicmatch Jukebox," May 18, 1998. Jan. 24, 2006 <http://www.musicmatch.com/info/company/press/releases/?year=1998&release=2>.

Steinberg, "Sonicblue Rio Car," Product Review, Dec. 12, 2000 http://electronics.cnet.com/electronics/0-6342420-1304-4098389.html.

Compaq, "The Personal Jukebox," Jan. 24, 2001 http://research.compacq.com/SRC/pjb/.

Extended Search Report issued Nov. 4, 2010 in EP Application No. 10008547.1.

"Apple's iPod Available in Stores Tomorrow," Press Release, Apple Computer, Inc. (Nov. 9, 2001). Jan. 25, 2006 <http://www.apple.com/pr/library/2001/nov/09ipod.html>.

"Apple Introduces iTunes—World's Best and Easiest to Use Jukebox Software," Press Release, Apple Computer, Inc. (Jan. 9, 2001). Jan. 25, 2006 <http://www.apple.com/pr/library/2001/jan/09itunes.html>.

"Apple Announces iTunes 2," Press Release, Apple Computer, Inc. (Oct. 23, 2001). Jan. 25, 2006 <http://www.apple.com/pr/library/2001/oct/23itunes.html>.

Chakarova, Mimi, et al., "Digital Still Cameras—Downloading Images to a Computer," Multimedia Reporting and Convergence. Jan. 25, 2006 <http://journalism.berkeley.edu/multimedia/tutorials/stillcams/downloading.html>.

"Personal Jukebox (PJB)," Systems Research Center and Paad, Compaq Computer Corp., Oct. 13, 2000.

Steinberg, "Sonicblue Rio Car," Product 4098389.html. Review, Dec. 12, 2000 http://electronics.cnet.com/electronics/0-6342420-1304-4098389.html.

Compaq, "The Personal Jukebox," Jan. 24, 2001 http://research.compaq.com/SRC/pjb/.

iTunes, Playlist Related Help Screens, iTunes v. 1.0, Apple Computer, Inc., Jan. 2001.

Specification Sheet, iTunes 2, Apple Computer, Inc., Oct. 31, 2001.

iTunes 2, Playlist Related Help Screens, iTunes v. 2.0, Apple Computer, Inc., Oct. 23, 2001.

SoundJamp MP Plus, Representative Screens, published by Casady and Greene, Inc., Salinas, CA 2000.

"SoundJam MP Plus Manual, ver. 2.0"—MP3 Player and Encoder for Macintosh by Jeffrey Robbin, Bill Kincaid and Dave Heller, 2000.

\* cited by examiner

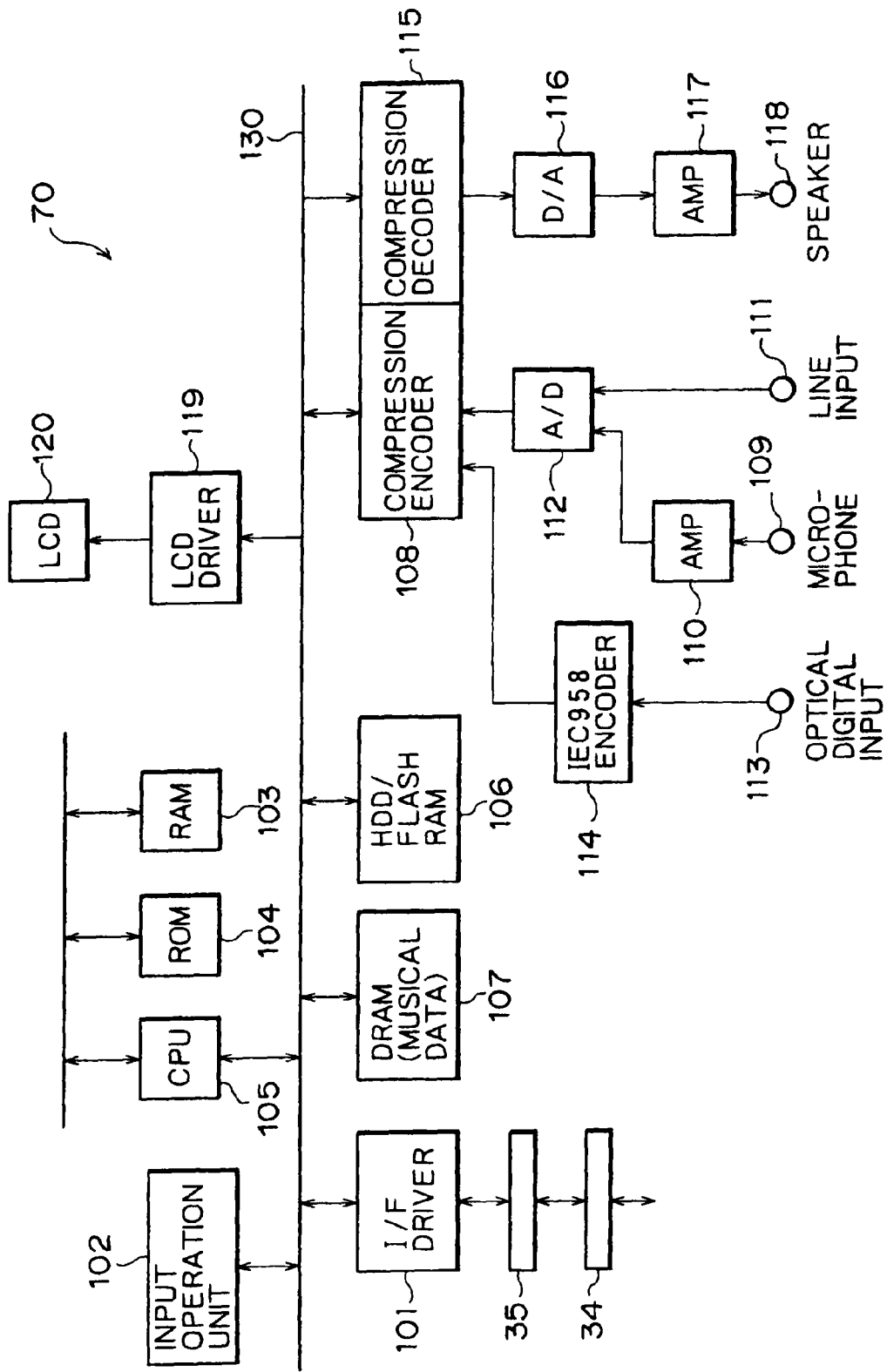

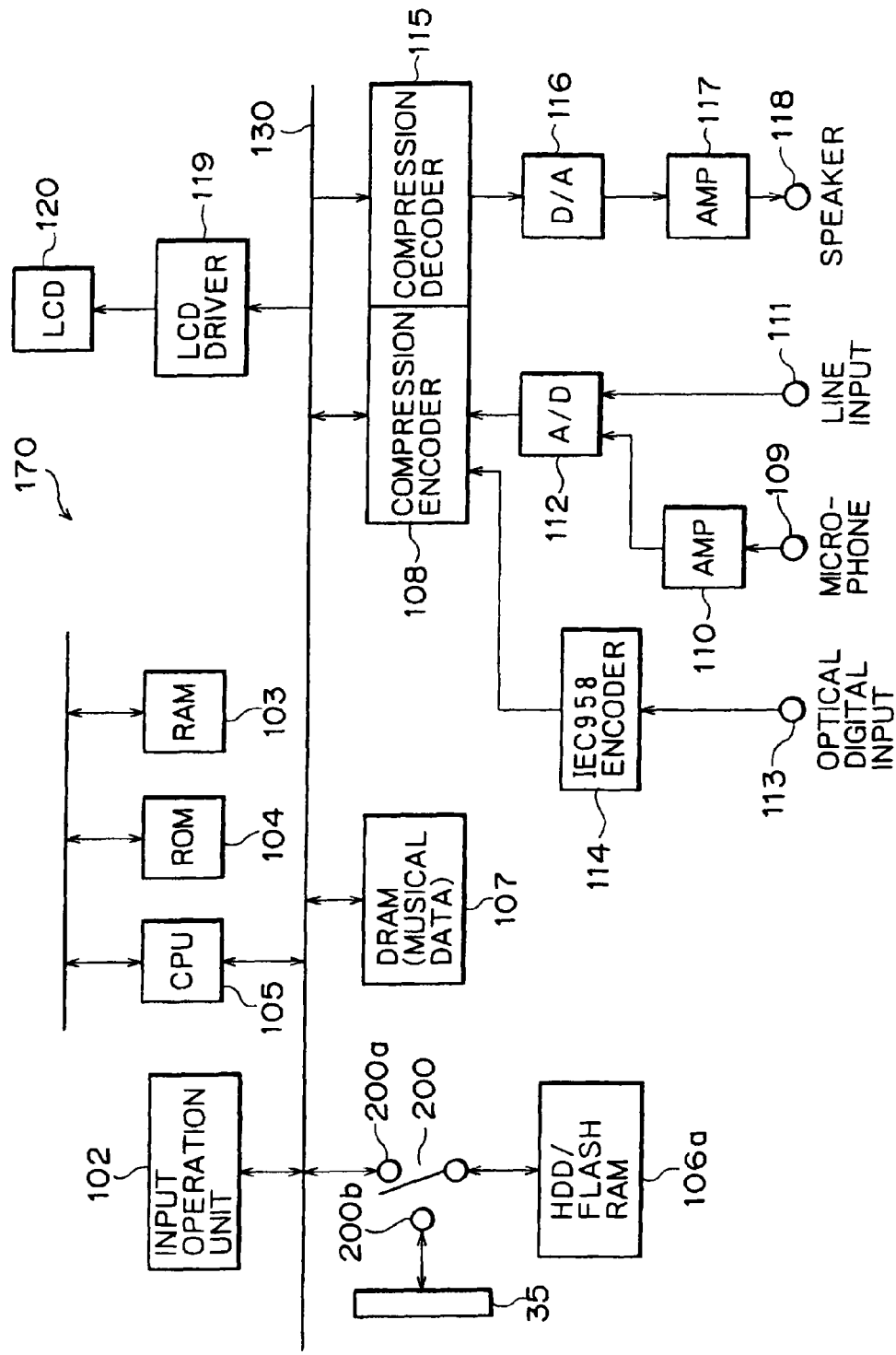

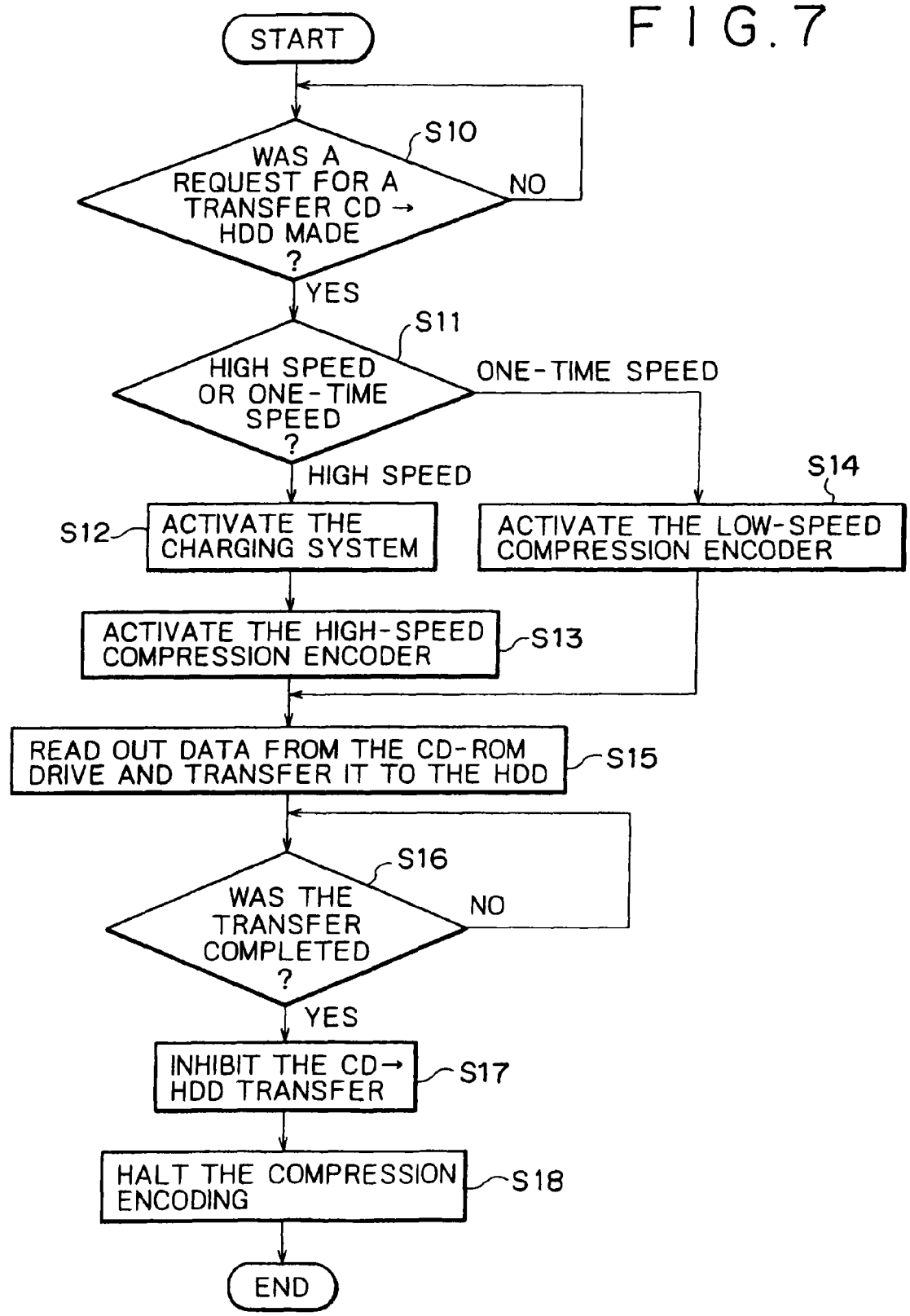

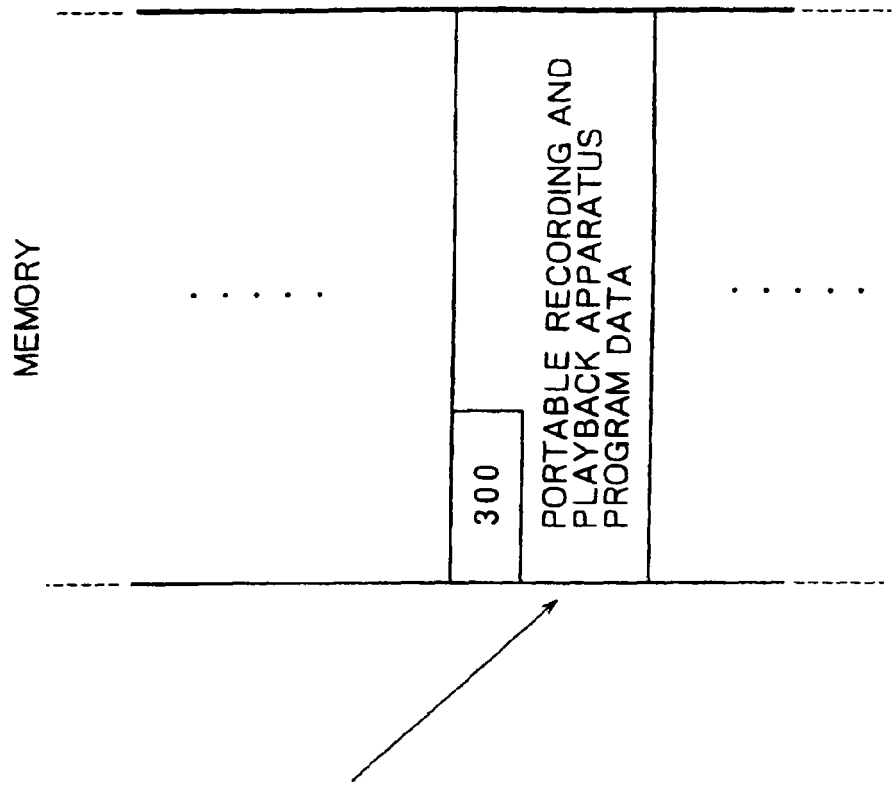

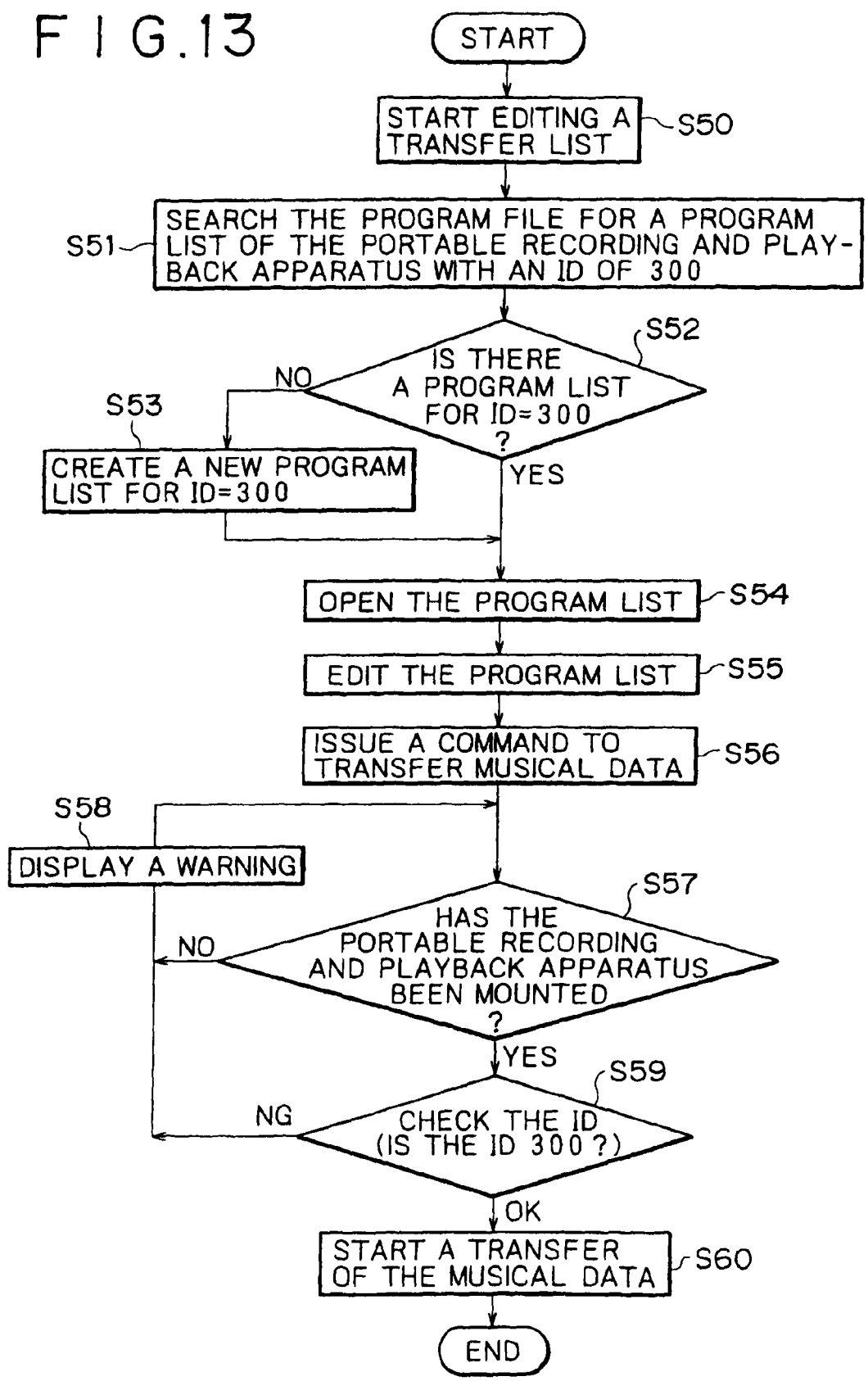

CONTENT MANAGEMENT SYSTEM FOR SEARCHING FOR AND TRANSMITTING CONTENT

CROSS-REFERENCE TO RELATED APPLICATIONS

This application is a continuation of U.S. application Ser. No. 11/431,181, filed May 16, 2006, which is a continuation of U.S. application Ser. No. 09/665,786, filed Sep. 20, 2000, now U.S. Pat. No. 7,130,251, issued Oct. 31, 2006. This application is based upon and claims the benefit of priority from the prior Japanese Patent Application No. 11-267135, filed Sep. 21, 1999. The entire contents of each of these documents are incorporated herein by reference.

BACKGROUND OF THE INVENTION

The present invention relates to an information communication system and its method as well as an information communication apparatus and its method, which are used for transmitting a plurality of pieces of data from equipment for storing data to other equipment.

As a conventional apparatus, there has been developed the so-called CD changer for accommodating a number of CDs (Compact Discs) and automatically playing back the CDs. In such a CD changer, several tens to several hundreds of CDs are accommodated in a single case, and a CD selected by a predetermined operation is automatically played back. The operation to play back CDs may be carried out for each selected CD. As an alternative, a plurality of CDs are selected and the operation to play back the CDs can be carried out for each of the CDs or carried out randomly for pieces of music recorded in the CDs. In general, the CD changer is installed permanently in a room.

As a portable audio-data playback apparatus, on the other hand, an apparatus using an optical disc or a magneto-optical disc with a diameter of about 64 mm has become popular in recent years. The portable audio-data playback apparatus converts an analog audio signal into a digital signal, compresses the digital signal by adoption of a compression technology known as ATRAC (Adaptive Transform Acoustic Coding: Trademark) and stores the compressed signal into a magneto-optical disc. The portable audio-data playback apparatus offers a merit of no deterioration of the sound quality caused by the operations to convert the analog audio signal into the digital signal, compress the digital signal and store the compressed signal. There is also another merit of a random playback operation due to the fact that a disc is used as a recording medium.

In the CD changer described above, however, it takes time to replace a CD with another even during an automatic playback operation. It is thus difficult to implement a continuous playback operation. In addition, a CD changer for accommodating 100 to 200 CDs has a large and heavy cabinet, which is very inconvenient when the CD changer is carried or installed.

Also in the portable audio-data playback apparatus described above, once audio data has been recorded onto a magneto-optical disc, the playback operation is limited to the range of the disc. That is to say, a random or general playback operation can not be carried out over a plurality of magneto-optical discs. It is thus necessary to replace a magneto-optical disc with several other magneto-optical discs in order to carry out a random playback operation from a plurality of magneto-optical discs or an operation to play back specified pieces of music. As a result, the user must always take a plurality of magneto-optical discs or optical discs with the portable audio-data playback apparatus.

In order to solve these problems, for example, there has been proposed a music server equipped with a recording medium such as a hard-disc drive having a relatively small size but a large recording capacity to serve as a CD changer described above. In a music server, audio data is read out from a CD, compressed and coded by adopting a predetermined technique and then recorded and stored in a hard-disc drive. By using a hard-disc drive with a recording capacity of about 6 Gbyte, musical data of about 1,000 pieces of music can be recorded. In addition, unlike the CD changer, time and labor to replace a CD with another are not required in a music server. As a result, the music server offers a merit of an easy continuous playback operation. Other merits include the fact that data of numerous pieces of music can be recorded into a unit of hard-disc drive and the fact that the cabinet can be made small in size.

It has been further proposed to use a hard-disc drive or a semiconductor memory as a recording or storage medium in the portable audio-data playback apparatus described above. The music server described above may be connected to the portable audio-data playback apparatus so that audio data stored in the music server can be transferred to the portable audio-data playback apparatus to be recorded or stored into the recording medium of the apparatus. Assume that the recording or storage capacity of the recording medium is 200 MB. In this case, it is no longer necessary for the user to carry a plurality of magneto-optical discs or optical discs. Of course, it is also unnecessary to replace a magneto-optical disc or an optical disc with another.

By the way, a music server is capable of storing a large amount of musical data as described above. Thus, if musical data is transferred from the music server to the portable audio-data playback apparatus by selecting pieces of music thereof to be transferred piece by piece, there will be raised a problem of cumbersome work to repeat the same operation several times.

In order to solve this problem, there has been conceived a data transfer method whereby a list of selected pieces of music from the musical data stored in the music server is created and the selected musical data on the list is transferred in a batch operation. With this method, however, there is raised another problem that it is quite within the bounds of possibility that a confusion occurs due to an unclear purpose as to whether a list created by the user is used to organize numerous pieces of musical data stored in the music server or used to transfer pieces of musical data in a batch operation.

SUMMARY OF THE INVENTION

It is thus an object of the present invention to provide an information communication system and its method as well as an information communication apparatus and its method that are capable of transferring musical data from an audio server to a portable audio-data playback apparatus with ease.

In order to solve the problems described above, according to the first aspect of the present invention, there is provided a communication system including a first apparatus having a first storage medium, and a second apparatus for transmitting data to the first apparatus, the second apparatus comprising: a second storage medium for storing management information of data to be transferred to the first storage medium; communication means for communicating data with the first apparatus; edit means capable of editing the management information; and control means for making a control to transfer data stored in the second storage medium to the first storage medium by way of the communication means on the basis of the management information edited by the edit means.

In addition, according to the second aspect of the present invention, there is provided a communication apparatus for transmitting data to another apparatus having a first storage medium, comprising: a second storage medium for storing management information of data stored in the first storage medium; communication means for communicating data with the another apparatus; edit means capable of editing the management information; and control means for making a control to transfer data stored in the second storage medium to the first storage medium by way of the communication means on the basis of the management information edited by the edit means.

Furthermore, according to the third aspect of the present invention, there is provided a communication method for communicating a first apparatus having a first storage medium to a second apparatus for transmitting data to the first apparatus, the method comprising the steps of: editing management information of data to be transferred to the first apparatus, on the second storage medium of the second apparatus, irrespective of the fact whether or not communication is established between the first apparatus and the second apparatus; and transmitting, when communication is established between the first apparatus and the second apparatus, data stored in the second storage medium to the first storage medium on the basis of the edited management information.

BRIEF DESCRIPTION OF THE DRAWINGS

FIG. 5 is a block diagram showing a typical configuration of a portable recording and playback apparatus;

FIG. 6 is a block diagram showing another typical configuration of a portable recording and playback apparatus;

FIG. 7 shows a flowchart representing typical processing carried out by a music server to record musical data read out from a CD into a hard-disc drive;

FIG. 12A is a diagram conceptually showing a typical management method for controlling a list of programs on the program file;

FIG. 12B is a diagram conceptually showing a typical management method for controlling a list of programs on the memory; and FIG. 13 shows a flowchart representing typical processing to edit a transfer list and to transfer musical data cataloged on the edited transfer list.

DETAILED DESCRIPTION OF THE INVENTION

Figure 1:
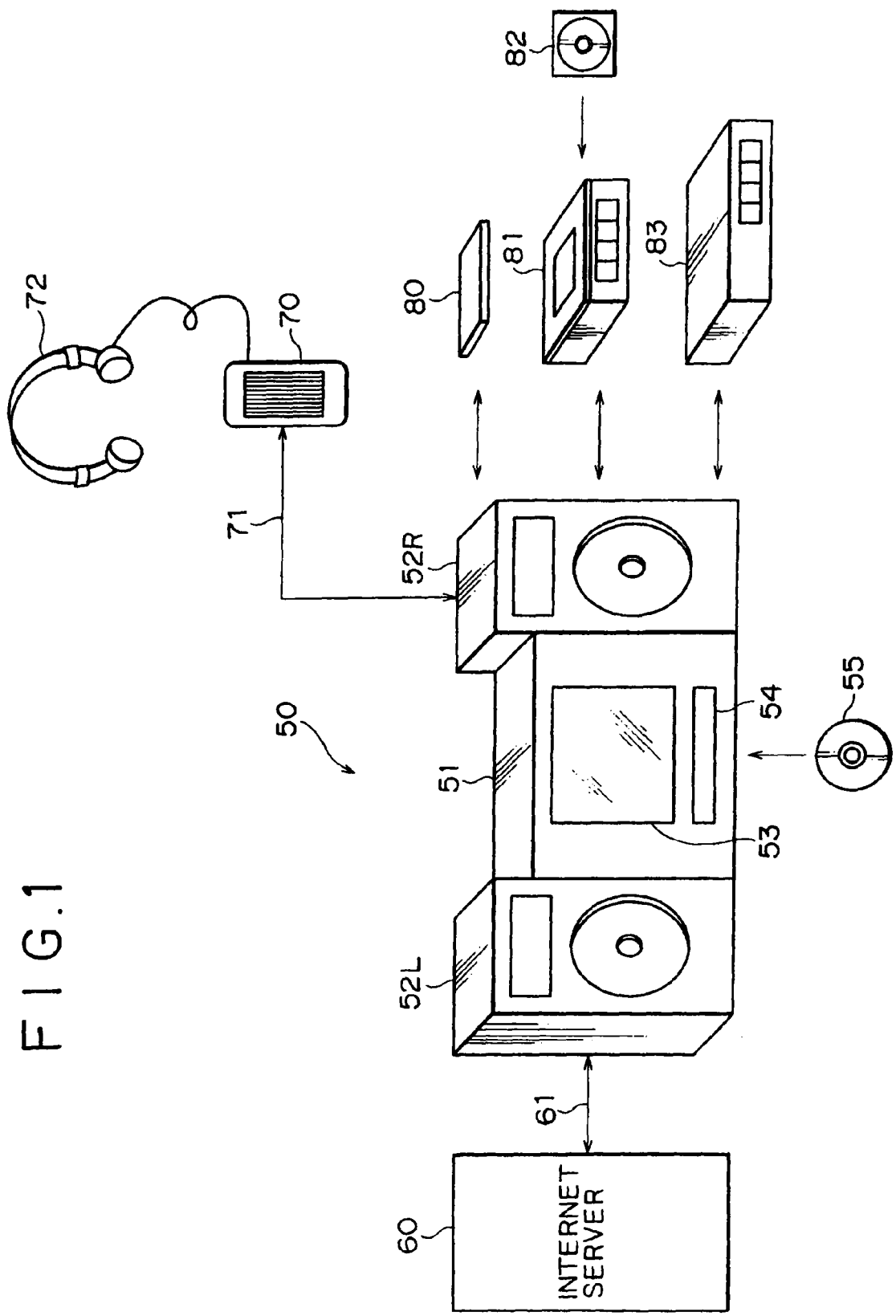
FIG. 1 is a diagram showing a music server provided by the present invention and a system employing the music server in a simple and plain manner.

Next, preferred embodiments of the present invention are explained by referring to diagrams. FIG. 1 is a diagram showing a music server provided by the present invention and a system employing the music server in a simple and plain manner. As shown in the figure, the music server 50 comprises a server main body 51 and speaker units 52L and 52R. The server main body 51 is provided with a display unit 53 implemented typically by an LCD (Liquid Crystal Display) panel and a CD insertion unit 54 for inserting a CD 55 into the server main body 51.

The server main body 51 has an operation unit comprising a plurality of operation switches to be operated by the user for executing functions of the server main body 51. It should be noted that the operation unit itself is not shown in FIG. 1. The server main body 51 may also be provided with a signal reception unit for receiving typically an infrared signal from a remote commander, which is operated to remotely execute the functions of the server main body 51. As will be described later, the server main body 51 also includes a controller for controlling a variety of operations by execution of a predetermined program, which is stored in advance typically in a ROM.

The user mounts a CD 55 on the server main body 51 through the CD insertion unit 54 and operates a predetermined switch on the operation unit not shown in the figure to play back musical data from the CD 55. A playback signal reproduced from the CD 55 is output to the speaker units 52L and 52R to allow the user to enjoy the musical data stored in the CD 55. If the CD 55 includes text data such as the name of a piece of music, the text data can be displayed on the display unit 53 as names of pieces of music or the like.

The music server 50 includes an internal large-capacity recording medium such as a hard disc. By operating a predetermined switch on the operation unit not shown in the figure, it is possible to record playback data reproduced from the CD 55 mounted on the server main body 51 through the CD insertion unit 54 into the recording medium such as a hard disc. At that time, it is possible to select a standard-speed recording technique or a high-speed recording technique. With the standard-speed recording technique, the playback data is recorded from the CD 55 into the recording medium at a transfer speed equal to a standard playback speed of the CD 55. With the high-speed recording technique, on the other hand, the playback data is recorded from the CD 55 into the recording medium at a transfer speed higher than the standard playback speed of the CD 55. With the high-speed recording technique, playback data reproduced from a selected CD 55 or playback data of a selected piece of music reproduced from the CD 55 is recorded from the CD 55 into the recording medium at a transfer speed higher than the standard playback speed of the CD 55 at a fee determined by a charging process according to a predetermined procedure.

In the music server 50, musical data played back from the CD 55 is subjected to a compression-encoding process according to a predetermined technique such as the ATRAC method described earlier to produce compressed musical data, which is then recorded into the recording medium such as a hard disc. In the case of a hard disc with a storage capacity of 6 Gbyte, for example, about 1,000 pieces of music can be stored or recorded. A list of names of recorded or stored pieces of music is displayed typically on the display unit 53. The user is then capable of playing back any arbitrary piece of music selected from the list displayed on the display unit 53 to show the names of pieces of music recorded or stored in the hard disc. As hard disc can be accessed at random, a large amount of musical data stored and recorded can be read out in arbitrary order and continuously played back by the music server 50.

There are a variety of usable compression-encoding techniques. This embodiment adopts a technique referred to as an ATRAC2 (Adaptive Transform Acoustic Coding 2) method disclosed in documents such as U.S. Pat. No. 5,717,821. This method is a compression-encoding technique resulting from extension of the ATRAC method adopted in the portable audio-data playback apparatus described above. This technique of compressing and encoding data makes use of frequency dependence of a minimum audible limit as well as a masking effect based on the sense of hearing, and utilizes a conversion-coding process in conjunction with an entropy-coding process. With this ATRAC2 method, encoding and decoding processes can be carried out at a high speed while a high sound quality is being maintained by using hardware with a relatively small size. It should be noted that, however, compression-encoding techniques other than ATRAC2, may be adopted such as ATRAC3, MPEG2ACC (Advanced Audio Code), MP3 (MPEG1 Audio Layer 3), TwinVQ (Transform-Domain weighted Interleave Vector Quantization) or MSAudio (WMA: Windows Media Audio).

The music server 50 can be connected to an external system by typically a public telephone line serving as a communication line 61 shown in FIG. 1. An example of the external system is an Internet server 60, which is a server connected to the Internet. By connecting the music server 50 to the Internet server 60 using the communication line 61, various kinds of information can be acquired from the Internet. The Internet server 60 has a data base for storing data such as information on titles of musical CDs available in the market. A unique key for making an access to the data base is assigned to the user. In order to make an access to the data base, the user utilizes the unique key. In this way, the user is capable of acquiring data related to a musical CD such as information on the title of the CD.

The Internet server 60 also carries out a charging process to compute a fee for a service rendered to the user of the music server 50. When musical data played back from the CD 55 is recorded into recording medium at a high transfer speed as described above, the music server 50 informs the Internet server 60 that such a recording operation is carried out at a high transfer speed. The Internet server 60 then carries out processing to compute a recording fee to be charged to the user, allowing a CD to be selected or a piece of music to be selected from a CD and musical data to be recorded from the selected CD or the selected piece of music to be recorded from the CD at a high transfer speed.

As described above, the processing to compute a recording fee is carried out by the Internet server 60, which has a lot of information related to CDs. It should be noted, however, that the scope of the present invention is not limited to this scheme. For example, the processing to compute a recording fee can also be carried out by another server, which is also connected to the Internet. As another alternative, the processing to compute a recording fee can also be carried out through a special-purpose network other than the Internet.

A portable recording and playback apparatus 70 has a recording medium, which is implemented by a hard disc or a flash memory such as a semiconductor memory, a magnetic memory and an optical memory. The portable recording and playback apparatus 70 may also be provided with another kind of storage medium or another kind of recording medium provided that the medium is capable of keeping up with a speed to play back music. By connecting the portable recording and playback apparatus 70 to the music server 50 using a connection line 71, musical data recorded in the music server 50 can be transmitted to the portable recording and playback apparatus 70 to be recorded in a storage medium employed in the portable recording and playback apparatus 70. In this case, while the musical data transmitted to the portable recording and playback apparatus 70 remains in the storage medium such as a hard disc or a flash memory in the music server 50, the musical data is put in a state of being irreproducible. The storage medium employed in the portable recording and playback apparatus 70 has a typical capacity of about 200 Mbyte, which allows data of tens of pieces of music to be stored or recorded. It should be noted that a storage device or a recording medium implemented by a semiconductor memory such as a flash memory and a recording medium implemented by a disc-shaped recording medium such as a hard disc are referred to as a storage medium, which is a generic name for these storage and recording media.

In accordance with the aforementioned transmission method adopted by the present invention, transmitted musical data is recorded into a storage medium employed in a destination of transmission and remains in a storage medium of a source of transmission but is put in a state of being irreproducible. This transmission operation is referred to as a move. By moving musical data in this way, a copy operation of musical data can be prevented from being carried out without limitation.

In the embodiment described above, the music server 50 is connected to the portable recording and playback apparatus 70 by the connection line 71. It should be noted, however, that this configuration is typical. As an alternative, the music server 50 is provided with a mounting unit matching another mounting unit employed in the portable recording and playback apparatus 70. In accordance with this alternative, the portable recording and playback apparatus 70 can be mounted on the music server 50 so that data can be exchanged between the music server 50 and the portable recording and playback apparatus 70. In addition to the electrical connections, the music server 50 can be provided with an interface unit matching another interface unit employed in the portable recording and playback apparatus 70. The interface units conform to typically an IrDA (Infrared Data Association) standard, which allows data to be exchanged between the interface units as an infrared ray signal. As a result, musical data can be exchanged between the music server 50 and the portable recording and playback apparatus 70 as an infrared ray signal.

The music server 50 may further be provided with a predetermined interface for exchanging information with a variety of media. Assume that the music server 50 is provided with an interface for a PC card 80. In this case, musical data distributed by means of the PC card 80 can be transferred to the music server 50, or data can be exchanged between a personal computer and the music server 50. The music server 50 may be provided with a serial digital interface implemented by an optical cable, which allows musical data to be exchanged with another digital musical-data recording and playback apparatus such as a disc recorder 81 for handling typically a small-size magneto-optical disc having a diameter of 64 mm. In this embodiment, a disc cartridge 82 for accommodating the small-size magneto-optical disc is mounted on the disc recorder 81. Musical data played back from the magneto-optical disc accommodated in the disc cartridge 82 is supplied to the music server 50. By the same token, the music server 50 may be provided with an interface such as an IEEE1394 interface for connection to a setup box 83 for CATV (cable television) or satellite broadcasting.

A PC card conforms to standardization of card-type peripherals for personal computers. The standardization is set jointly by the PCMCIA (Personal Memory Card International Association) of the U.S. and the JEIDA (Japanese Electronic Industry Development Association) of Japan. The IEEE1394 standard is an interface standard adopted by the Institute of Electrical and Electronic Engineers of the U.S.

The music server 50 may be provided with a WWW (World Wide Web) browser as an embedded application. By connecting the music server 50 provided with a WWW browser to the Internet server 60 using the communication line 61, the Internet can be searched for a variety of contents described typically in an HTML (Hypertext Markup Language) and any of the contents can then be displayed on the display unit 53.

With the configuration described above, the user is capable of playing back musical data stored or recorded in the music server 50 or musical data from the CD 55 mounted on the music server 50 via the CD insertion unit 54 and listening to the reproduced musical data through the speaker units 52L and 52R.

By a communication between the music server 50 and the Internet server 60, the music server 50 can automatically acquire information such as the title of a CD 55 mounted on the music server 50 via the CD insertion unit 54 from the Internet server 60 through the communication line 61. Information such as a CD title acquired from the Internet server 60 is saved in the music server 50 and the saved information is displayed on the display unit 53 employed in the music server 50 when necessary.

To put it concretely, the music server 50 first transmits information unique to the user such as user ID data of the music server 50 to the Internet server 60. The information unique to the user is referred to hereafter as user information. The Internet server 60 carries out authentication and charging based on the user information received from the music server 50. The Internet server 60 also receives media information of a CD desired by the user or a CD being played back from the music server 50. The Internet server 60 then searches a data base for additional information associated with musical data indicated by the media information. The additional information includes the title of a song, the name of a performer, a song composer, a libretto writer, a libretto and a jacket image. Then, the Internet server 60 transmits predetermined information on the CD requested by the user.

An example of the media information transmitted to the Internet server 60 is of a TOC (Table of Contents) of the CD 55. The Internet server 60 includes the data base, which can be searched for additional information associated with musical data indicated by the TOC. As an alternative, the Internet can also be searched for a WWW server to get additional information by the Internet server 60. The Internet server 60 searches the data base for additional information associated with musical data indicated by the TOC received from the music server 50 and used as the media information. For example, the Internet server 60 searches the data base for a playback time duration of each piece of music, which is included in the TOC and recorded on the CD 55.

The Internet server 60 then transmits the additional information obtained as a result of the search operation to the music server 50. The music server 50 displays the additional information received from the Internet server 60 on the display unit 53. The additional information is also stored by a CPU 8 to be described later into typically the hard-disc drive along with the TOC information of the CD 55. It should be noted that the additional information can also be transmitted by the Internet server 60 as data embedded in an HTML file and displayed by WWW browser software embedded in the music server 50.

If the additional information includes another described URL (Uniform Resource Locator) on the Internet, the music server 50 is capable of making an access to a home page on the Internet indicated by the other URL.

In addition, by having data communicated between the Internet server 60 and the music server 50, musical data recorded on the CD 55 mounted on the music server 50 through the CD insertion unit 54 can be recorded into the recording medium employed in the music server 50 at a speed higher than a standard playback speed prescribed for the CD 55 so that typically musical data of a piece of CD 55 can be recorded in about 2 minutes by the music server 50. If no communication is established between the Internet server 60 and the music server 50, on the other hand, the musical data is recorded into the recording medium employed in the music server 50 at a one-time speed, that is, a speed equal to the standard playback speed prescribed for the CD 55 by the music server 50.

By connecting the music server 50 to the portable recording and playback apparatus 70 using a connection line 71, musical data stored or recorded in the music server 50 can be transmitted or, strictly speaking, moved to the portable recording and playback apparatus 71. The moved data can then be played back by the portable recording and playback apparatus 70 even if the music server 50 is disconnected from the portable recording and playback apparatus 71 via the connection line 71. Typically, the user is capable of listening to the musical data played back by the portable recording and playback apparatus 70 by using a headphone 72. As described earlier, the musical data transmitted or, strictly speaking, moved to the portable recording and playback apparatus 70 can no longer be played back in the music server 50.

Figure 2:
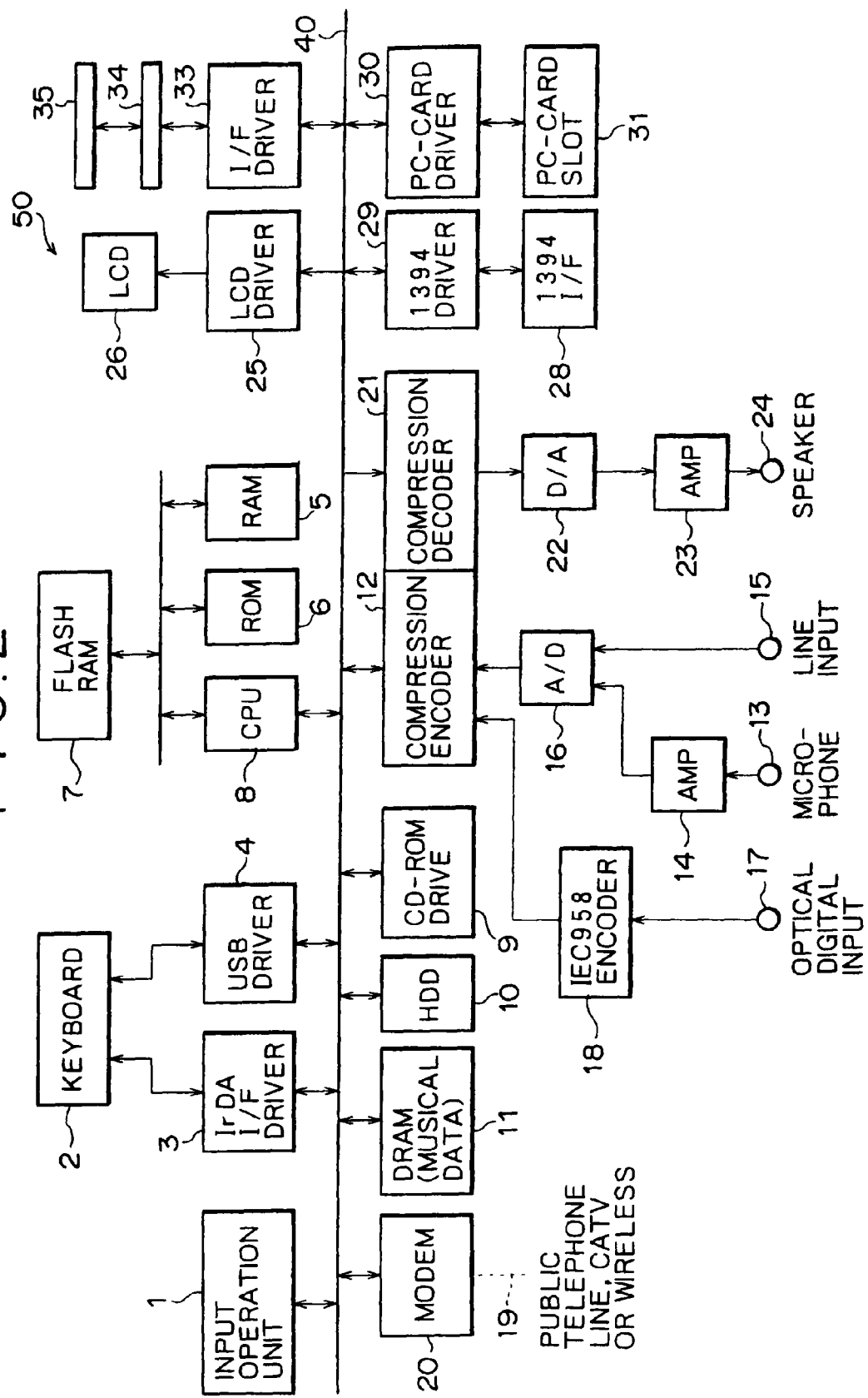
FIG. 2 is a block diagram showing a typical configuration of the music sever.

FIG. 2 is a block diagram showing a typical configuration of the music server 50. In the first place, the music server 50 comprises a RAM 5, a ROM 6, a flash memory 7 and a CPU 8, which are connected to each other by a local bus as is the case with an ordinary personal computer. The CPU 8 is also connected to a bus 40. The CPU 8 functions as a controller controlling all operations of the music server 50.

The ROM 6 is used for storing in advance a program for controlling the operation of the music server 50. The program is executed by the CPU 8 to perform processing corresponding to an operation carried out on an input operation unit 1 to be described later. A task area and a data area, which are required in the execution of the program, are secured temporarily in the RAM 5 and the flash memory 7. The ROM 6 is also used for storing a program loader for loading the program from the ROM 6 into the flash memory 7.

The input operation unit 1 comprises typically a plurality of push-type and rotary-type operation keys and switches each actuated by an operation of any of these operation keys. As an alternative, the input operation unit 1 may also be implemented by a rotary-push-type key known as a jog dial or a touch panel on the LCD. Of course, the input operation unit 1 may adopt a switch mechanism, which reacts to a press operation. A signal representing an operation carried out on the input operation unit 1 is supplied to the CPU 8 by way of the bus 40. The CPU 8 generates a control signal for controlling the operation of the music server 50 on the basis of the signal received from the input operation unit 1. The music server 50 operates in accordance with the control signal generated by the CPU 8.

An infrared ray interface (IrDa I/F) driver 3 and/or a USB (Universal Serial Bus) drive 4 are connected to the bus 40. A keyboard 2 is constructed to be capable of communicating with the IrDa I/F driver 3 and the USB driver 4 or can be connected to the IrDa VF driver 3 and the USB driver 4. By using the keyboard 2, the user can enter information such as the title of recorded musical data and the name of an artist with ease. It is also possible to adopt a configuration wherein data is transferred by way of the IrDa I/F driver 3 or the USB driver 4. It should be noted that the IrDa I/F driver 3 and the USB driver 4 could be eliminated.

A CD-ROM drive 9 is connected to the bus 40. A CD 55 inserted into the CD insertion unit 54 as described earlier is mounted on the CD-ROM drive 9. The CD-ROM drive 9 reads out musical data from the set CD 55 at a prescribed standard playback speed. The CD-ROM drive 9 is also capable of reading musical data from the CD 55 at a speed higher than the prescribed standard playback speed such as a speed 16 times or 32 times the prescribed standard playback speed.

It should be noted that the CD-ROM drive 9 is not limited to the example described above. For example, the CD-ROM drive 9 can be adapted to another disc-shaped recording medium for recording musical data. Examples of the other disc-shaped recording medium are a magneto-optical disc and a DVD (Digital Versatile Disc). A drive for a memory card can also be employed. In addition, data read out by the CD-ROM drive 9 is not limited to musical data. It is also possible for the CD-ROM drive 9 to read out information such as picture data, text data and program data.

A hard-disc drive 10, which is abbreviated hereafter to an HDD, is also connected to the bus 40. Musical data read out by the CD-ROM drive 9 is recorded into the HDD 10. Before being recorded into the HDD 10, the musical data is subjected to pre-processing. To put it in detail, the musical data read out by the CD-ROM drive 9 is supplied to a compression encoder 12 by way of the bus 40 and an audio DRAM 11.

The compression encoder 12 carries out processing to compress and encode musical data typically by adoption of the compression method disclosed in U.S. Pat. No. 5,717,821 described earlier. It should be noted that musical data could be compressed by the compression encoder 12 at either one of 2 speeds, namely, a low speed and a high speed, either of which is selected in accordance with control executed by the CPU 8. The low compression speed corresponds to the standard playback speed prescribed for the CD 55 in the CD-ROM drive 9. Typically, the compression speed is switched from the low speed to the high one and vice versa in accordance with the playback speed of the CD 55 in the CD-ROM drive 9. The compression encoder 12 implements an encoding algorithm according to the compression speed.

It should be noted that the technique adopted by the compression encoder 12 to change the compression speed is not limited to the method described above. For example, the compression speed can also be changed by switching the clock frequency of the compression encoder 12. As an alternative, the two compression speeds are implemented by two different pieces of hardware. As another alternative, musical data is compressed by the compression encoder 12 at the low processing speed by thinning the high-speed compression.

The musical data completing the compression-encoding process in the compression encoder 12 is supplied to the HDD 10 by way of the DRAM 11 to be stored or recorded in the HDD 10.

As described above, the musical data completing the compression-encoding process in the compression encoder 12 is supplied to the HDD 10 to be stored or recorded therein. It should be noted, however, that musical data read out by the CD-ROM drive 9 can also be supplied directly to the HDD 10 to be stored or recorded onto a hard disc of the HDD 10.

In this embodiment, an audio signal supplied by a microphone connected to a terminal 13 by way of an amplifier 14 or an audio signal input from a line input terminal 15 is supplied to the compression encoder 12 by way of an A/D converter 16. The audio signal compressed and encoded by the compression encoder 12 can be recorded in the HDD 10. In addition, an optical digital signal from an optical digital input terminal 17 is also supplied to the compression encoder 12 by way of an IEC-958 (International Electrotechnical Commission 958) encoder 18. The optical digital signal, which is also an audio signal, is compressed and encoded by the compression encoder 12. The compressed and encoded audio signal can be recorded onto the hard disc of the HDD 10.

In the embodiment described above, the compression encoder 12 adopts an encoding algorithm like the one disclosed in U.S. Pat. No. 5,717,821. It should be noted, however, that the scope of the present invention is not limited to this embodiment. That is to say, the compression encoder 12 may adopt another algorithm as long as the algorithm is an encoding algorithm for compressing information. The compression encoder 12 may adopt, other than the algorithm mentioned above, PASC (Precision Adaptive Sub-band Coding), RealAudio (a trademark) or LiquidAudio (a trademark) algorithm.

A modem 20 is also connected to the bus 40. The modem 20 is connected to an external network 19 such as a public telephone line, a CATV, a satellite communication network or wireless communication. The music server 50 is capable of establishing communication through the external network 19 by way of the modem 20.

Connected typically to the Internet by the external network 19, the music server 50 is capable of communicating with the Internet server 60 at a remote location. The music server 50 transmits various kinds of information to the Internet server 60. The information includes a request signal, media information, user ID data, user information and charging information for the user. The media information is data related to the CD 55 mounted on the CD-ROM drive 9. The user ID data and the user information are assigned in advance to the music server 50.

As described above, various kinds of data including the media information and the user information are transmitted to the Internet server 60. On the basis of the user information such as the user ID data received from the music server 50, the Internet server 60 carries out authentication of the user and a charging process for the user. The Internet server 60 also searches a data base for additional information for musical data indicated by the media information received from the music server 50. The additional information is then transmitted to the music server 50.

As described above, additional information associated with musical data is transmitted to the music server 50. It should be noted, however, that musical data itself could also be supplied directly to the music server 50 from the external network 19. In other words, the user is capable of downloading musical data from the Internet server 60 to the music server 50. That is to say, musical data is transmitted to the music server 50 in response to media information. For example, a bonus track of a predetermined CD 55 can be distributed to users.

In a playback operation, musical data compressed and encoded by the compression encoder 12 and then recorded and stored in the HDD 10 is read out from the HDD 10 and supplied to a compression decoder 21 by way of the bus 40. The compression decoder 21 decodes and decompresses the compressed musical data read out from the HDD 10. The decoded and decompressed musical data is then supplied to a D/A converter 22 before being supplied to a terminal 24 by way of an amplifier 23. The data is then supplied to the speaker units 52L and 52R from the terminal 24 as music obtained as a result of the playback operation. It should be noted that, in the case of a stereo system which is not shown in FIG. 2, there are two routes from the D/A converter 22 to the terminal 24 by way of the amplifier 23. Of course, two terminals 24 are provided in the stereo system.

The compression decoder 21 adopts a decoding algorithm serving as a counterpart of the encoding algorithm adopted in the compression encoder 12. The compression encoder 12 and the compression decoder 21 can also be implemented by software executed by the CPU 8 instead of hardware.

A liquid crystal display panel 26, which is abbreviated to an LCD panel serving as the display unit 53, is connected to the bus 40 by an LCD driving circuit 25. The CPU 8 supplies a rendering control signal to the LCD driving circuit 25 by way of the bus 40. The LCD driving circuit 25 drives the LCD panel 26 in accordance with the rendering control signal received from the CPU 8 to make a predetermined display appear on the display unit 53.

For example, an operation menu of the music server 50 is displayed on the LCD panel 26. As another example, a list of titles of compressed musical data recorded and stored in the HDD 10 may also be displayed on the LCD panel 26. The list of titles displayed on the LCD panel 26 is based on data stored in the HDD 10. This stored data is based on data obtained as a result of decoding additional information received from the Internet server 60. In addition, a folder and a jacket image associated with selected playback compressed musical data may also be displayed on the LCD panel 26. The displayed folder and the jacket image are based on additional information received from the Internet server 60.

The user operates the keyboard 2 or a pointing device of the input operation unit 1 on the basis of a screen displayed on the LCD panel 26. The CPU 8 controls processing to play back musical data requested by an operation carried out by the user on the keyboard 2 or the pointing device of the input operation unit 1. Control of an operation to delete selected musical data and an operation to copy or move selected musical data to an external apparatus can also be based on a screen displayed on the LCD panel 26. For example, the input operation unit 1 may be implemented by a touch panel provided on the LCD panel 26. In this case, by touching the touch panel in accordance with a screen displayed on the LCD panel 26, the user is capable of operating the music server 50. In this way, the user is capable of administering and controlling musical data stored or recorded in the HDD 10 by using the LCD panel 26 as an interface.

In the first embodiment, a PC-card slot 31 and an IEEE1394 interface 28 are each used as an interface between the music server 50 and an external general information apparatus. The IEEE1394 interface 28 is connected to the bus 40 by an IEEE1394 driver 29. On the other hand, the PC-card slot 31 is connected to the bus 40 by a PC-card driver 30.

The IEEE1394 interface 28 allows data to be exchanged between the music server 50 and typically a personal computer. In addition, the IEEE1394 interface 28 allows musical data to be input from a source such as a satellite-broadcasting IRD (Integrated Receiver/Decoder), a small-size optical disc and a small-size magneto-optical disc with a diameter of about 64 mm, a DVD (Digital Versatile Disc: a trademark) or a digital video tape. A PC card mounted on the PC-card slot 31 serves as one of a variety of peripheral extensions such as an external memory device, another media drive, a modem, a terminal adaptor and a capture board.

An interface 34 allows musical data to be exchanged between the music server 50 and another compatible recording and playback apparatus. The other recording and playback apparatus can be the portable recording and playback apparatus 70 shown in FIG. 1 or another music server 50.

The interface 34 is connected to the bus 40 by an interface driver 33. The other compatible recording and playback apparatus includes an interface 35 as the counterpart of the interface 34. By electrically connecting the interface 34 to the interface 35 by using a predetermined connection line 71, for example, the music server 50 is capable of transmitting musical data stored in the HDD 10 to the other recording and playback apparatus.

Figure 3:
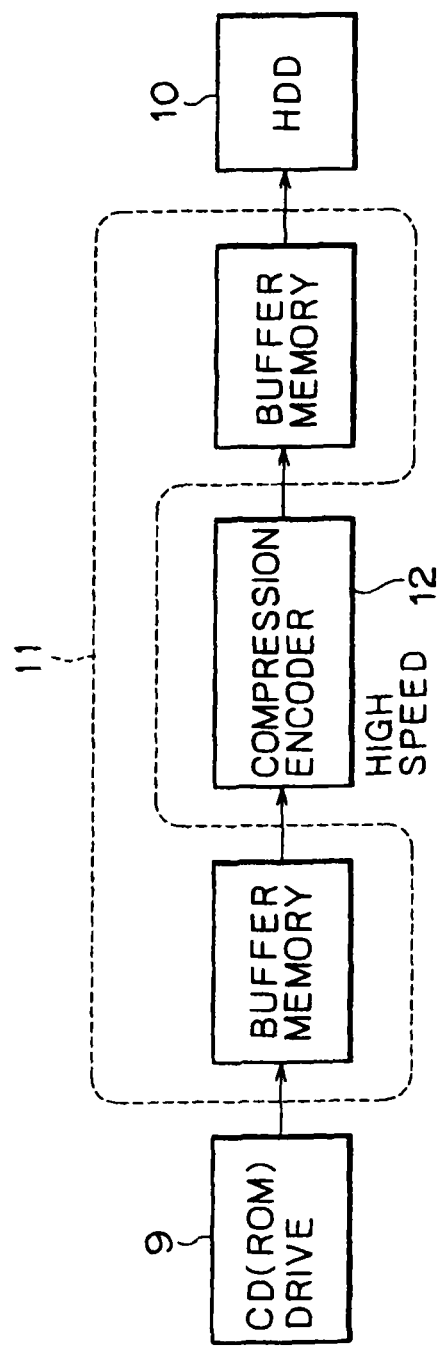
FIG. 3 is a diagram showing a flow of a signal through a series of processes from an operation to read out musical data from a CD-ROM drive to an operation to record the data into a hard-disc drive in a simple and plain manner.

FIG. 3 is a diagram showing a flow of a signal through a series of processes from an operation to read out musical data from the CD-ROM drive 9 to an operation to record the data into the HDD 10 in a simple and plain manner. The musical data read out from the CD-ROM drive 9 is once stored into the DRAM 11, which is used as a buffer memory. The musical data is then read out back from the DRAM 11 with a predetermined timing and supplied to the compression encoder 12 by way of the bus 40. As described above, the compression encoder 12 compresses the musical data at a predetermined compression speed corresponding to the playback speed of the CD-ROM drive 9. The musical data compressed and encoded by the compression encoder 12 is again stored temporarily into the DRAM 11, which is used as a buffer memory. The musical data is then read out back from the DRAM 11 with a predetermined timing and supplied by way of the bus 40 to the HDD 10 to be stored into the hard disc of the HDD 10. At that time, information on the CD 55 undergoing a playback operation in the CD-ROM drive 9 is transmitted to the Internet server 60. In response to the information, the Internet server 60 transmits additional information for the CD 55, which is also recorded into the hard disc of the HDD 10. The CPU 8 and other components control the additional information and the compressed musical data obtained as a result of compression of the musical data read out from the CD 55 as described above.

Figure 4:
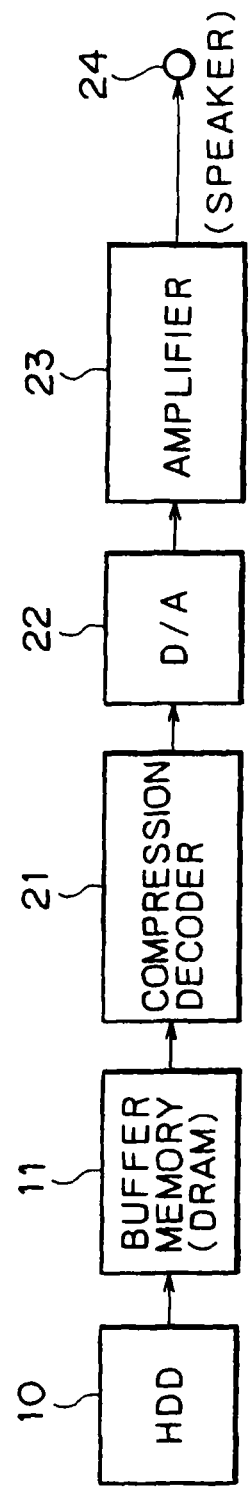
FIG. 4 is a diagram showing a flow of a signal through a series of processes from an operation to read out compressed musical data from the hard-disc drive to an operation to output data completing playback processing to a terminal in a simple and plain manner.

FIG. 4 is a diagram showing a flow of a signal through a series of processes from an operation to read out compressed musical data from the HDD 10 to an operation to output data completing playback processing to a terminal 24 in a simple and plain manner. The compressed musical data read out from the HDD 10 is once stored into the DRAM 11, which is used as a buffer memory. The compressed musical data is then read out back from the DRAM 11 with a predetermined timing and supplied to the compression decoder 21 by way of the bus 40. As described above, the compression decoder 21 decodes and decompresses the compressed musical data to reproduce the musical data, supplying the musical data to a D/A converter 22. The D/A converter 22 converts the musical data into an analog audio signal, which is amplified by an amplifier 23 and output to the terminal 24 as a playback output. If a speaker is connected to the terminal 24, the user is capable of enjoying music played back by the speaker. At that time, additional information read out along with the compressed musical data from the HDD 10 is decoded by the CPU 8 and other components to be displayed on the display unit 53 as a musical name and the like.

FIG. 5 is a block diagram showing a typical configuration of the portable recording and playback apparatus 70. As shown in the figure, the portable recording and playback apparatus 70 generally has a configuration similar to that of the music server 50 shown in FIG. 2. Normally, the portable recording and playback apparatus 70 is carried by the user and used as standalone equipment by disconnecting the interface 35 of the portable recording and playback apparatus 70 from the interface 34 employed in the music server 50.

In the first place, the portable recording and playback apparatus 70 comprises a RAM 103, a ROM 104, and a CPU 105, which are connected to each other by a local bus as is the case with an ordinary personal computer. Of course, a flash memory can also be provided like the configuration of the music server 50 described above. The CPU 105 is also connected to a bus 130. The CPU 105 functions as a controller controlling all operations of the portable recording and playback apparatus 70.

The ROM 104 is used for storing in advance a program for controlling the operation of the music apparatus 70. The program is executed to perform processing corresponding to an operation carried out on an input operation unit 102 to be described later. A task area and a data area, which are required in the execution of the program, are secured temporarily in the RAM 103.

The input operation unit 102 comprises typically a plurality of push-type and rotary-type operation keys and switches each actuated by an operation of any of these operation keys. As an alternative, the input operation unit 102 may also be implemented by a rotary-push-type key known as a jog dial or a touch panel on the LCD. Of course, the input operation unit 102 may adopt a mechanical switch mechanism, which reacts to a press operation. A signal representing an operation carried out on the input operation unit 102 is supplied to the CPU 105 by way of the bus 130. The CPU 105 generates a control signal for controlling the operation of the portable recording and playback apparatus 70 on the basis of the signal received from the input operation unit 102. The signal is generated by the input operation unit 102 to represent an operation carried out on an operation key of the input operation unit 102. The operation of the portable recording and playback apparatus 70 is switched and controlled in accordance with the control signal generated by the CPU 105.

Musical data read out from the HDD 10 of the music server 50 to be transferred to the portable recording and playback apparatus 70 in response to a request is transmitted or supplied to the portable recording and playback apparatus 70 by way of the interface 35, the connection line connecting the interface 35 to the interface 34 and the interface 34. At the same time, additional information associated with the musical data requested to be transferred is transmitted to the portable recording and playback apparatus 70 along with the musical data. If the music server 50 is provided with a mounting unit matching another mounting unit employed in the portable recording and playback apparatus 70, the interface 35 can be directly connected to the interface 34 so that data can be exchanged between the music server 50 and the portable recording and playback apparatus 70. As an alternative, the music server 50 may be provided with an interface unit matching another interface unit employed in the portable recording and playback apparatus 70. If the interface units conform to typically an IrDA (Infrared Data Association) system, which allows data to be exchanged between the interface units as an infrared ray signal, musical data can be exchanged between the music server 50 and the portable recording and playback apparatus 70 as an infrared ray signal.

The musical data supplied by the music server 50 to the portable recording and playback apparatus 70 is transferred from an interface driver 101 by way of the bus 130 to an HDD 106, which serves as a musical-data recording medium in the portable recording and playback apparatus 70 to be recorded into a hard disc in the HDD 106.

It should be noted that the musical-data recording medium in the portable recording and playback apparatus 70 is not limited to the HDD 106. For example, a flash memory can also be used. As a matter of fact, for example, another recording medium such as a magneto-optical disc can be employed as the musical-data recording medium in the portable recording and playback apparatus 70 provided that the recording medium is capable of keeping up with the speed to play back the musical data. If a recoding medium with a storage capacity of, say, 200 Mbyte is employed as the musical-data recording medium in the portable recording and playback apparatus 70, the recording medium will be capable of recording tens of pieces of music. The hard disc of the HDD 106 employed in the portable recording and playback apparatus 70 is used for storing musical data and additional information associated with the musical data, which are received from the music server 50.

In this example, musical data received from the music server 50 and recorded into the HDD 106 is compressed musical data already completing a compression/encoding process in the music server 50. It should be noted, however, that the portable recording and playback apparatus 70 is not limited to this embodiment. That is to say, musical data not completing a compression/encoding process can also be recorded into the hard disc of the HDD 106. For example, musical data read out from the CD 55 mounted on the CD-ROM drive 9 employed in the music server 50 can be supplied to the portable recording and playback apparatus 70 by way of an interface driver 101. It is worth noting, however, that when musical data is supplied to the portable recording and playback apparatus 70 directly, the number of pieces of musical data that can be recorded is limited considerably.

As part of pre-processing prior to an operation to record musical data into the hard disc of the HDD 106, the musical data supplied thereto is temporarily stored into an audio DRAM 107 connected to the bus 130. The musical data is then read back from the DRAM 107 and supplied to a compression encoder 108 through the bus 130. The compression encoder 108 carries out a compression-encoding process on the musical data by adoption of an encoding algorithm equivalent to the encoding algorithm adopted by the compression encoder 12 employed in the music server 50. The compressed musical data completing the compression-encoding process in the compression encoder 108 is again supplied to the DRAM 107 to be stored temporarily therein once more. Finally, the compressed musical data is read out from the DRAM 107 and recorded into the hard disc of the HDD 106.

As described above, a request can be made to move compressed musical data stored in the HDD 10 employed in the music server 50 to the portable recording and playback apparatus 70. After the compressed musical data is transmitted or transferred to the portable recording and playback apparatus 70 at such a request, the compressed musical data in the HDD 10 remains as data that can not be read out and played back from the HDD 10. However, the compressed musical data moved to the portable recording and playback apparatus 70 can be returned back to the recording medium serving as a move source, that is, the HDD 10 employed in the music server 50. The compressed musical data returned back to the move source can be played back by the music server 50. When the compressed musical data is returned back to the music server 50, the compressed musical data is deleted from the hard disc of the HDD 106 employed in the portable recording and playback apparatus 70, which serves as a move destination. That is to say, the compressed musical data returned back to the music server 50 is erased from a recording medium of the move destination.

In this embodiment, an audio signal supplied by a microphone connected to a terminal 109 by way of an amplifier 110 or an audio signal input from a line input terminal 111 is supplied to the compression encoder 108 by way of an A/D converter 112. The audio signal output by the A/D converter 112, and compressed and encoded by the compression encoder 108 can be recorded in the HDD 106. In addition, an optical digital signal from an optical digital input terminal 113 is also supplied to the compression encoder 108 by way of an IEC-958 (International Electrotechnical Commission 958) encoder 114. The optical digital signal, which is also an audio signal, is compressed and encoded by the compression encoder 108. The compressed and encoded audio signal can be recorded onto the hard disc of the HDD 106. If the portable recording and playback apparatus 70 is a portable playback-only apparatus only for playing back musical data, recording components such as the A/D converter 112 and the compression encoder 108 can all be eliminated.

In a playback operation, the compressed musical data is read out from the HDD 106 and supplied to a compression decoder 115 by way of the bus 130. The compression decoder 115 decodes and decompresses the compressed musical data read out from the HDD 106. The decoded and decompressed musical data is then supplied to a D/A converter 116 before being supplied to a terminal 118 by way of an amplifier 117. By mounting a headphone 72 on the terminal 118, the user is capable of enjoying the reproduced music. It should be noted that, in the case of a stereo system which is not shown in FIG. 5, there are provided two routes from the D/A converter 116 to the terminal 118 by way of the amplifier 117 for left and right (L and R) channels respectively. Of course, two terminals 118 are provided in the stereo system for the L and R channels respectively.

An LCD panel 120 is connected to the bus 130 by an LCD driving circuit 119. The CPU 105 supplies a rendering control signal to the LCD driving circuit 119 by way of the bus 130. The LCD driving circuit 119 drives the LCD panel 120 in accordance with the rendering control signal received from the CPU 105 to make a predetermined display appear on the LCD panel 120. For example, an operation menu of the portable recording and playback apparatus 70 is displayed on the LCD panel 120. As another example, a list of titles of compressed musical data recorded and stored in the HDD 106 may also be displayed on the LCD panel 120. In addition, a folder and a jacket image associated with selected playback compressed musical data may also be displayed on the LCD panel 120. The displayed folder and the jacket image are based on additional information stored in the HDD 106.

The user operates a pointing device of the input operation unit 102 on the basis of a screen displayed on the LCD panel 120. Control of an operation to select a piece of compressed musical data among those stored in the HDD 106 and an operation to delete selected musical data, or copy or move selected musical data to another apparatus can also be based on a screen displayed on the LCD panel 120. For example, the input operation unit 102 may include a touch panel. In this case, by touching the touch panel in accordance with a screen displayed on the LCD panel 120, the user is capable of entering an operation input to the portable recording and playback apparatus 70. In this way, the user is capable of administering compressed musical data stored in the HDD 106 as well as controlling processing such as operations to play back compressed musical data stored in the HDD 106 and recording compressed musical data into the HDD 106 by using the LCD panel 120 as an interface.

It should be noted that the portable recording and playback apparatus 70 is driven by a battery, which is not shown in FIG. 5. That is why the portable recording and playback apparatus 70 is provided with a power supply unit employing an ordinary secondary battery or a dry battery as a power supplying source, and is provided with an electrical charging unit. With the mounting unit of the portable recording and playback apparatus 70 connected directly to the mounting unit of the music server 50 or with the connection lines, the electrical charging unit electrically charges the secondary battery employed in the portable recording and playback apparatus 70 with electrical power received from the music server 50 during a transfer of musical data from the music server 50 to the portable recording and playback apparatus 70. It is needless to say that the secondary battery employed in the portable recording and playback apparatus 70 can also be electrically charged by an external electrical charging unit. It should be noted that, as the power supply to serve as a power supplying source of the portable recording and playback apparatus 70, only one of the dry cell and the rechargeable secondary battery can also be used or provided.

FIG. 6 is a diagram showing another typical configuration of the portable recording and playback apparatus 70. It should be noted that, in the configuration shown in FIG. 6, members identical with those employed in the configuration shown in FIG. 5 are denoted by the same reference numerals as the latter and detailed explanation of such members is not repeated. The portable recording and playback apparatus 70 shown in FIG. 6 is different from the configuration shown in FIG. 5 in that, in the case of the former, a switch circuit 200 is provided between the HDD (or the flash memory) 106*a* and the bus 130. One of select terminals 200*a* of the switch circuit 200 is connected to the bus 130 while another select terminal 200*b* is connected to the interface 35. The switch circuit 200 isolates the HDD 106*a* from the bus 130.

When compressed musical data is received from the music server 50, the switch circuit 200 is set at the select terminal 200*b*, that is, the select terminal 200*b* is selected. With the select terminal 200*b* selected, the HDD 106*a* is directly connected to the bus 40 employed in the music server 50 by the interface 35 and the interface 34. In this connection, the HDD 106*a* appears to the CPU 8 employed in the music server 50 as if the HDD 106*a* were a local recording medium in the music server 50. Thus, the CPU 8 employed in the music server 50 is capable of controlling the HDD 106*a* directly. As a result, compressed musical data can be moved and transferred between the music server 50 and the portable recording and playback apparatus 70 with ease under the control of the CPU 8.

Next, the operation of the information communication system having the configuration described above is explained. First of all, functions executed by the music server 50 as a standalone apparatus are described. FIG. 7 shows a flowchart representing typical processing carried out by the music server 50 to record musical data read out from the CD 55 mounted on the CD-ROM drive 9 onto a hard disc of the HDD 10.

As shown in the figure, the flowchart begins with a step S10 at which the music server 50 enters a state of waiting for a request to be made to record musical data read out from the CD 55 mounted on the CD-ROM drive 9 onto a hard disc of the HDD 10. As the user makes such a request by, for example, operating the input operation unit 1, the flow of the processing goes on to a step S11 to form a judgment as to whether the user made a request for high-speed recording or one-time-speed recording. Typically, when the user makes such a request at the step S10, the user also specifies a recording technique. To be more specific, the user also specifies whether the request is a request for high-speed recording or one-time-speed recording. The one-time-speed recording is an operation to read out musical data from the CD 55 and to record the data into the hard disc of the HDD 10 at a standard speed prescribed for the CD 55. On the other hand, the high-speed recording is an operation to read out musical data from the CD 55 and to record the data into the hard disc of the HDD 10 at a speed at least twice the standard speed prescribed for the CD 55.

If the outcome of the judgment formed at the step S11 indicates that the high-speed recording was specified, the flow of the processing goes on to a step S12 at which a charging system of the Internet server 60 or the music server 50 is activated. The processing carried out by the charging system of the Internet server 60 or the music server 50 will be described in detail later. At any rate, a charging process for the music server 50 is carried out and, if the requested high-speed recording of musical data from the Internet server 60 or other sources is permitted, the flow of the processing goes on to a step S13 at which a high-speed compression process is activated in the compression encoder 12. The flow of the processing then goes on to a step S15.

If the outcome of the judgment formed at the step S11 indicates that the one-time-speed recording was specified, on the other hand, the flow of the processing goes on to a step S14 at which a low-speed compression process is activated in the compression encoder 12. The flow of the processing then goes on to the step S15.

At the step S15, the CD-ROM drive 9 is driven at a predetermined speed and musical data is read out from the CD 55 mounted on the CD-ROM drive 9 in accordance with control executed by the CPU 8. The musical data read out from the CD 55 is subjected to a compression-encoding process in the compression encoder 12 before being transferred to the HDD 10 to be recorded on a hard disc thereof.

If the transfer of the musical data read out from the CD 55 to the HDD 10 is found completed at a step S16, the flow of the processing goes on to a step S17 at which a transfer of data from the CD-ROM drive 9 to the HDD 10 is inhibited. At the next step S18, the compression processing at the compression encoder 12 is halted.

Figure 8A:
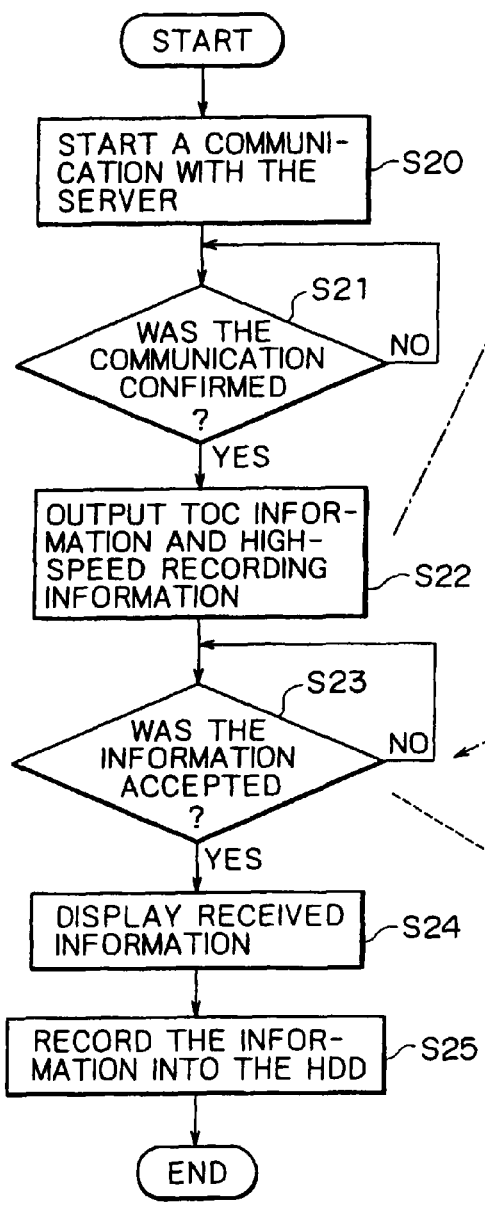
FIG. 8A shows a flowchart representing typical processes of a music server for processing to record musical data read out from a CD into a hard-disc drive at a high speed.
Figure 8B:
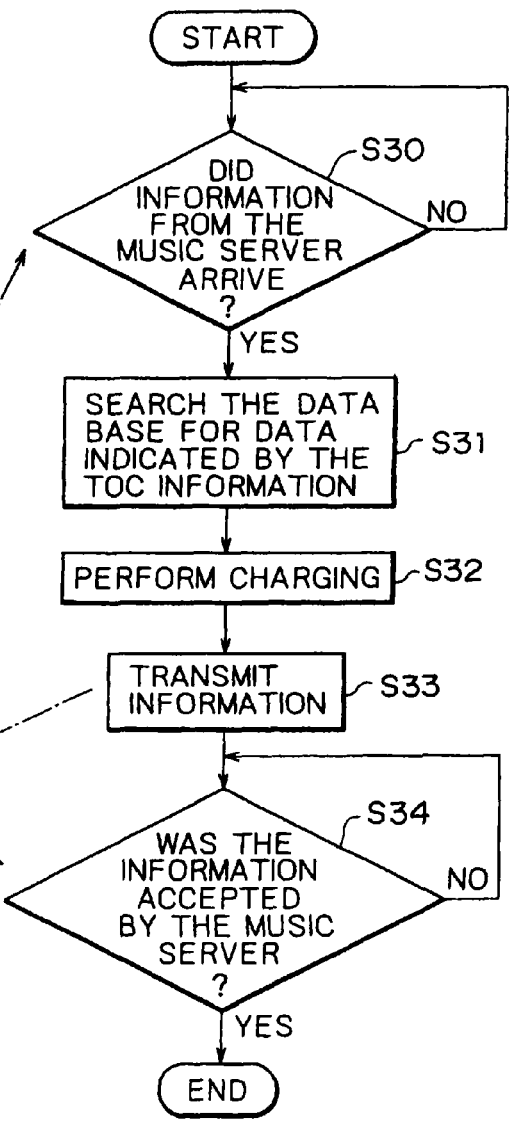
FIG. 8B shows a flowchart representing typical processes of an Internet server for processing to record musical data read out from a CD into a hard-disc drive at a high speed.

FIGS. 8A and 8B show a flowchart representing typical charging processes of the charging system carried out at the step S12 of the flowchart shown in FIG. 7. The charging process is carried out when data is communicated between the music server 50 and the Internet server 60. FIG. 8A shows a flowchart representing a partial charging process of the charging system for the music server 50 and FIG. 8B shows a flowchart representing a partial charging process of the charging system for the Internet server 60.

As shown in FIG. 8A, the flowchart begins with a step S20 when the charging process is started. At this step, communication is established by adopting a predetermined protocol between the music server 50 and the Internet server 60. The flow of the process then goes on to a step S21 to form a judgment as to whether a connection has been established between the music server 50 and the Internet server 60 and communications are possible between the music server 50 and the Internet server 60. If a connection has been established to allow communications, the flow of the process goes on to a step S22.

At the step S22, the TOC information of the CD 55 mounted on the CD-ROM drive 9 of the music server 50 with the user ID corresponding to the music server 50 is output to the Internet server 60. The CD 55 is a CD, from which data is to be transferred from the 10 CD-ROM drive 9 of the music server 50 and to be recorded onto the hard disc of the HDD 10. The music server 50 also transmits high-speed-recording information indicating that high-speed recording is to be carried out to the Internet server 60 along with the TOC information.

On the other hand, the flowchart shown in FIG. 8B begins with a step S30 at which the Internet server 60 enters a state of waiting for the user ID, the high-speed-recording information and the TOC information to arrive from the music server 50. As the Internet server 60 receives the user ID, the high-speed-recording information and the TOC information, the flow of the process goes on to a step S31 at which the Internet server 60 searches the data base thereof for information indicated by the TOC information. The information indicated by the TOC information may also be acquired from an external data base. The information indicated by the TOC information is used for identifying the CD 55.

At the next step S32, a charging process is carried out. To put it in detail, a recording fee is computed from information such as the number of pieces of music to undergo the high-speed recording. The fee can then be drawn from a bank account specified by the user using the user's credit-card number corresponding to the user ID cataloged in advance. The fee charging method is not limited to such a technique. Another technique to charge a recording fee to the user, where the charging process is performed on the music server 50 side, is conceivable. For example, the music server 50 may be provided with a function to read a prepaid card. In this case, the computed recording fee is transmitted to the music server 50, which draws the fee from the prepaid card. The recording fee may also be charged depending on contents of the CD 55 under the control of the Internet server 60, which can be identified from the TOC information. It is also possible to prohibit an operation to record musical data read out from the CD 55 onto the hard disc of the HDD 10.

At the next step S33, the charging information is transmitted to the music server 50. Then, the charging process continues to a step S23 of the flowchart shown in FIG. 8A at which the music server 50 checks the substance of the charging information received from the Internet server 60. In the mean time, at a step S34 of the flowchart shown in FIG. 8B, the Internet server 60 verifies whether or not the charging information was received by the music server 50 as follows. Typically, after the music server 50 confirms that the charging information received from the Internet server 60 was correctly received with no errors, the music server 50 transmits data indicating the confirmation to the Internet server 60.

If the music server 50 confirms reception of the charging information at the step S23 of the flowchart shown in FIG. 8A, the flow of the process goes on to a step S24 at which the charging information and other data are displayed on the display unit 53. At the next step S25, musical data is read out by the CD-ROM driver 9 from the CD 55 at a high speed and then subjected to a compression process in the compression encoder 12 also at a high compression speed. The compressed musical data output by the compression encoder 12 is then supplied to the HDD 10 to be stored onto the hard disc of the HDD 10. The step S25 corresponds to the step S15 of the flowchart shown in FIG. 7.

Figure 9:
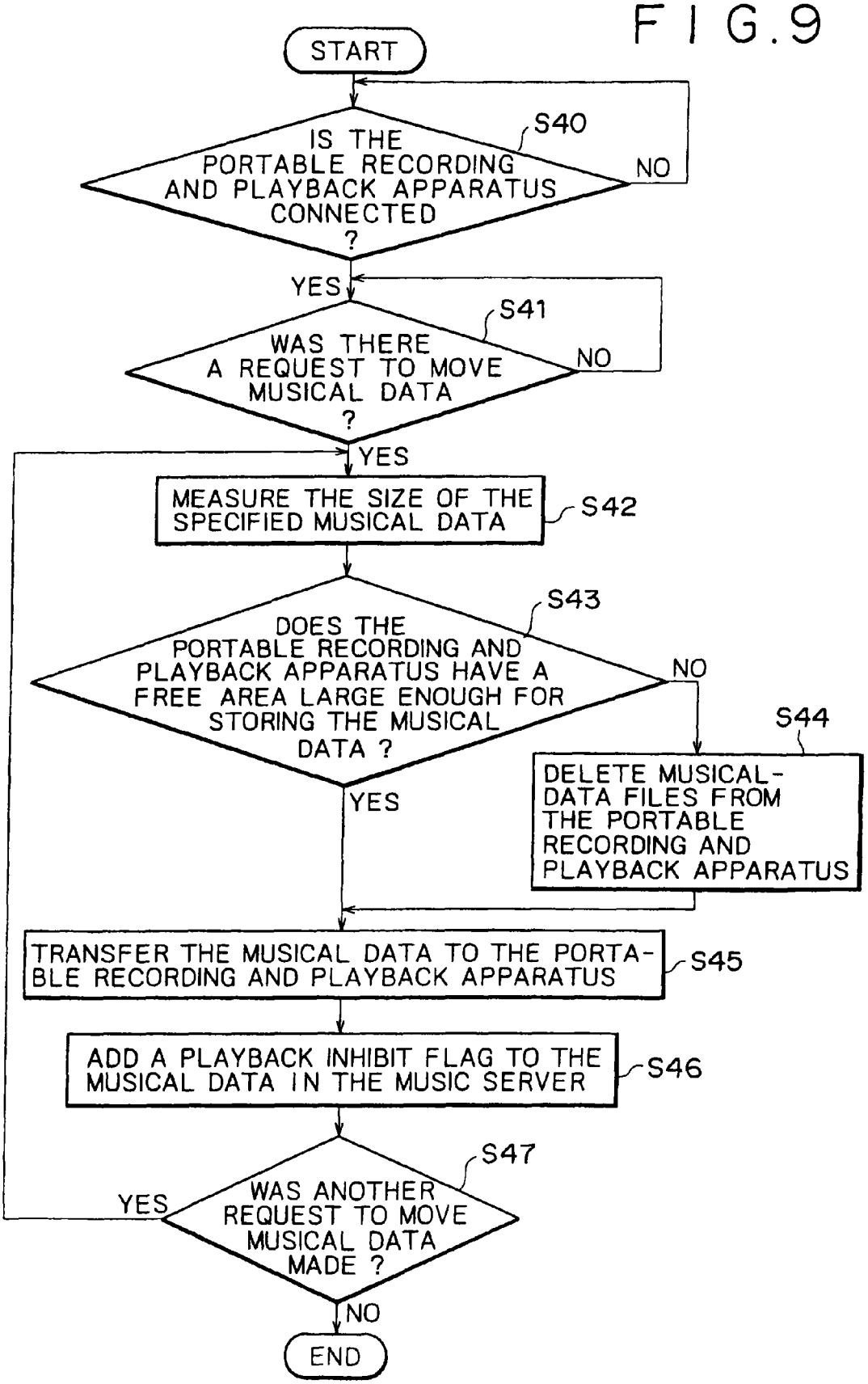
FIG. 9 shows a flowchart representing typical processing to move musical data in accordance with the present invention.

By the way, in this embodiment, a coordinated operation between the music server 50 and the portable recording and playback apparatus 70 is possible. When musical data is moved from the music server 50 to the portable recording and playback apparatus 70, for example, a coordinated operation is carried out between two devices. FIG. 9 shows a flowchart representing this move operation.

As shown in the figure, the flowchart begins with a step S40 to form a judgment with the CPU 8 as to whether or not the music server 50 and the portable recording and playback apparatus 70 are connected to each other by the interfaces 34 and 35. The connection between the music server 50 and the portable recording and playback apparatus 70 can be detected by, for example, CPU 8 exchanging a predetermined signal between the interfaces 34 and 35. In addition to an exchange of a signal between the interfaces 34 and 35 by the CPU 8, a switch mechanism is provided on the junction between the music server 50 and the portable recording and playback apparatus 70 to serve as a mechanical detection mechanism for CPU 8 detecting connection between the music server 50 and the portable recording and playback apparatus 70.

If the connection between the music server 50 and the portable recording and playback apparatus 70 is verified at the step S40, the flow of the processing goes on to a step S41 to form a judgment with the CPU 8 as to whether or not there is a request for an operation to move musical data stored or recorded in the HDD 10 to the portable recording and playback apparatus 70. Typically, a list of pieces of information such as mainly titles of pieces of musical data stored in the HDD 10 is displayed on the display unit 53. The user is allowed to make a request for an operation to move musical data stored or recorded in the HDD 10 to the portable recording and playback apparatus 70 by specifying the title of a specific piece of musical data among those on the list appearing on the display unit 53. A title can be specified by the user by, for example, operating a pointing device on the input operation unit 1. The request for an operation to move the specific musical data stored or recorded in the HDD 10 to the portable recording and playback apparatus 70 is then entered by the user via the input operation unit 1.

There are conceivable techniques of entering a request for an operation to move compressed musical data stored or recorded in the HDD 10 to the portable recording and playback apparatus 70 via the input operation unit 1. In accordance with one of the techniques, a button for making a request for an operation to move compressed musical data stored or recorded in the HDD 10 to the portable recording and playback apparatus 70 is displayed on the display unit 53, and the user specifies this button by using the pointing device of the input operation unit 1. In accordance with another technique, an icon is displayed on the display unit 53 for each piece of compressed musical data and the user moves the icon of a piece of compressed musical data to be transferred to an icon of the move destination, the portable recording and playback apparatus 70, also displayed on the display unit 53 in the so-called drag and drop operation. In this case, the destination of the move operation is the portable recording and playback apparatus 70. Of course, a request for an operation to move compressed musical data stored or recorded in the HDD 10 to the portable recording and playback apparatus 70 can also be made by operating an operation switch provided on the input operation unit 1. CPU 8 makes the judgment by detecting the input operation mentioned above whether or not the request for movement is made.

If the outcome of the judgment formed at the step S41 indicates that a request for an operation to move compressed musical data stored or recorded in the HDD 10 to the portable recording and playback apparatus 70 was made, the flow of the processing goes on to a step S42 at which typically the CPU 8 employed in the music server 50 examines the file size of the compressed musical data to be moved, that is, the amount of data. At the next step S43, the CPU 105 employed in the portable recording and playback apparatus 70 which can communicate with the CPU 8 examines the size of a free area in the HDD 106 and, typically, the CPU 8 employed in the music server 50 compares the size of the free size with the file size of the compressed musical data to be moved examined at the step S42. The CPU 8 forms a judgment as to whether or not the compressed musical data to be moved can be recorded into the free area in the HDD 106 at the step 43. The formation of the judgment is based on the result of the comparison carried out at the step S43. If the outcome of the judgment indicates that the compressed musical data to be moved can be recorded into the free area in the HDD 106, the flow of the processing goes on to a step S45 at which the operation to move the compressed musical from the music server 50 to the portable recording and playback apparatus 70 is started.

If the outcome of the judgment formed with the CPU 8 at the step S43 indicates that the size of the free area in the HDD 106 employed by the portable recording and playback apparatus 70 is not sufficient, on the other hand, the flow of the processing goes on to a step S44. At the step S44, the CPU 105 employed in the apparatus 70 deletes some compressed musical data already recorded in the HDD 106 automatically or in accordance with a procedure or a technique described later so that the compressed musical data to be moved can be recorded into the HDD 106. The flow of the processing then goes on to the step S45.

At the step S44, compressed musical data is deleted from the HDD 106 automatically under control executed by the CPU 105 on the basis of a predetermined parameter of compressed musical data already recorded in the HDD 106. For example, in the portable recording and playback apparatus 70, the number of playback-operation executions is counted for each piece of compressed musical data recorded in the HDD 106. Pieces of compressed musical data may then be deleted from the HDD 106 starting with one having a smallest number of playback-operation executions. Pieces of compressed musical data may also be deleted from the HDD 106 starting with that having a least recent recording date where a recording date is a date on which a piece of compressed musical data is recorded into the HDD 106.

When pieces of compressed musical data are deleted from the HDD 106 automatically at the step S44, it is quite within the bounds of possibility that a piece of compressed musical data of importance to the user is erased from the HDD 106. In order to prevent a piece of compressed musical data of importance to the user from being erased, a warning message is displayed on the display unit 53 employed in the music server 50 or the LCD panel 120 of the portable recording and playback apparatus 70. The warning message may notify the user that an operation to delete a piece of compressed musical data automatically from the HDD 106 will be carried out or may be a list of pieces of compressed musical data to be deleted. In this case, a piece of compressed musical data will be deleted only if the deletion is approved by the user. As another alternative, the user selects a piece of compressed musical data from those on a list displayed on the display unit 53 employed in the music server 50 or the LCD panel 120 of the portable recording and playback apparatus 70.

When the flow of the processing departs from the step S43 or S44, a piece of compressed musical data to be moved from the HDD 10 employed in the music server 50 to the HDD 106 can be recorded into the HDD 106. At the next step S45, the transmission or the transfer of the compressed musical data from the music server 50 to the portable recording and playback apparatus 70 is started. That is to say, the compressed musical data read out from the HDD 10 is supplied to the portable recording and playback apparatus 70 by way of the bus 40 and the interface 34. In the portable recording and playback apparatus 70, the compressed musical data received from the music server 50 through the interface 34 is recorded into the HDD 106 by way of the interface 35.

The compressed musical data transferred to the portable recording and playback apparatus 70 remains also in the HDD 10 employed in the music server 50 as it was before the transfer. In this embodiment, however, an operation to play back compressed musical data remaining in the HDD 10 but already transferred or moved to the portable recording and playback apparatus 70 is prohibited at the step S46. Typically, a playback inhibit flag is set upon completion of the transfer of the compressed musical data to the portable recording and playback apparatus 70 to indicate that an operation to play back the compressed musical data from the HDD 10 is prohibited. That is to say, the playback inhibit flag prevents the CPU 8 employed in the music server 50 from playing back the compressed musical data remaining in the HDD 10 but already transferred or moved to the portable recording and playback apparatus 70. The playback inhibit flag also indicates that the compressed musical data recorded in the HDD 10 has virtually migrated from the music server 50 to the portable recording and playback apparatus 70. Thus, even if a plurality of same pieces of compressed musical data exist in both the music server 50 and the portable recording and playback apparatus 70, only one of them can be played back. As a result, an operation to illegally copy musical data is prohibited.

The flow of the processing then goes on to a step S47 to form a judgment as to whether or not a request to move a next piece of musical data to the portable recording and playback apparatus 70 is made. If a request to move a next piece of musical data to the portable recording and playback apparatus 70 is made, the flow of the processing goes back to the step S42. If no request to move a next piece of musical data to the portable recording and playback apparatus 70 is made, on the other hand, the processing to move a series of pieces of musical data is completed.

As described above, at the steps S42 to S46 of the flowchart shown in FIG. 9, only one of a plurality of pieces of compressed musical data stored in the HDD 10 is moved from the music server 50 to the portable recording and playback apparatus 70. It should be noted, however, that the way to move compressed musical data is not limited to what is described above. For example, a plurality of pieces of compressed musical data stored in the HDD 10 can also be moved from the music server 50 to the portable recording and playback apparatus 70 simultaneously at the same time in a batch operation.

In the embodiment described above, the compressed musical data physically left in the HDD 10 of the music server 50 serving as the move source but virtually moved to the portable recording and playback apparatus 70 is merely put in a playback inhibit status at the step S46. It should be noted, however, that, the way to handle compressed musical data moved to the portable recording and playback apparatus 70 is not limited to what is described above. For example, the compressed musical data moved to the portable recording and playback apparatus 70 can be deleted from the HDD 10. That is to say, the compressed musical data itself can be physically erased from the HDD 10.

In the embodiment described above, compressed musical data is moved from the music server 50 to the portable recording and playback apparatus 70. It is worth noting, however, that compressed musical data can also be moved in the opposite direction by carrying out processing similar to the processing represented by the flowchart shown in FIG. 9. That is to say, compressed musical data recorded in the HDD 106 of the portable recording and playback apparatus 70 can be moved to the HDD 10 employed in the music server 50.

When a piece of compressed musical data moved from the music server 50 to the portable recording and playback apparatus 70 is moved back from the portable recording and playback apparatus 70 to the music server 50, the playback inhibit flag of the piece of compressed musical data in the HDD 10 employed in the music server 50 is reset. By resetting the playback inhibit flag, the piece of compressed musical data, which was the source of the original move, can again be played back in the music server 50. The compressed musical data, which was present in the HDD 106 employed in the apparatus 70 but moved back to the music server 50, is deleted from the HDD 106. As an alternative, instead of deleting the compressed musical data itself, the portable recording and playback apparatus 70 may also delete management information of the compressed musical data from a management table.

With this embodiment, the user is capable of creating a list of programs. A list of programs is a list of pieces of music properly selected from those recorded in the HDD 10 employed in the music server 50. The music server 50 displays an edit screen on the display unit 53. The edit screen is used for creating and editing a list of programs. That is to say, the user is capable of editing an existing list of programs and creating a new list of programs by using the edit screen. The user is capable of controlling pieces of musical data recorded in the HDD 10 of the music server 50 by using a list of programs. A list of programs created in this way is stored in predetermined memory means such as the HDD 10. The music server 50 may have a plurality of program lists.

The user is capable of selecting a plurality of favorite pieces of musical data recorded in the HDD 10 of the music server 50 as a collection on a list of programs and playing back the favorite pieces of musical data for enjoyment like a CD album. In addition, a plurality of pieces of musical data put on a list of programs can be moved from the music server 50 to the portable recording and playback apparatus 70 in a batch operation.

The present invention also provides dedicated edit means for editing a list of programs used when moving a plurality of pieces of musical data in a batch operation. The following description explains a list of programs for use in a batch operation to move musical data and processing to create and edit such a list of programs.

It should be noted that, in the following description, a list of pieces of musical data stored in the HDD 10 of the music server 50 is referred to as a stock list, and a list of pieces of musical data to be transferred from the music server 50 to the portable recording and playback apparatus 70 is known as a transfer list. The stock list and the transfer list are each a kind of program list described above.

Figure 10:
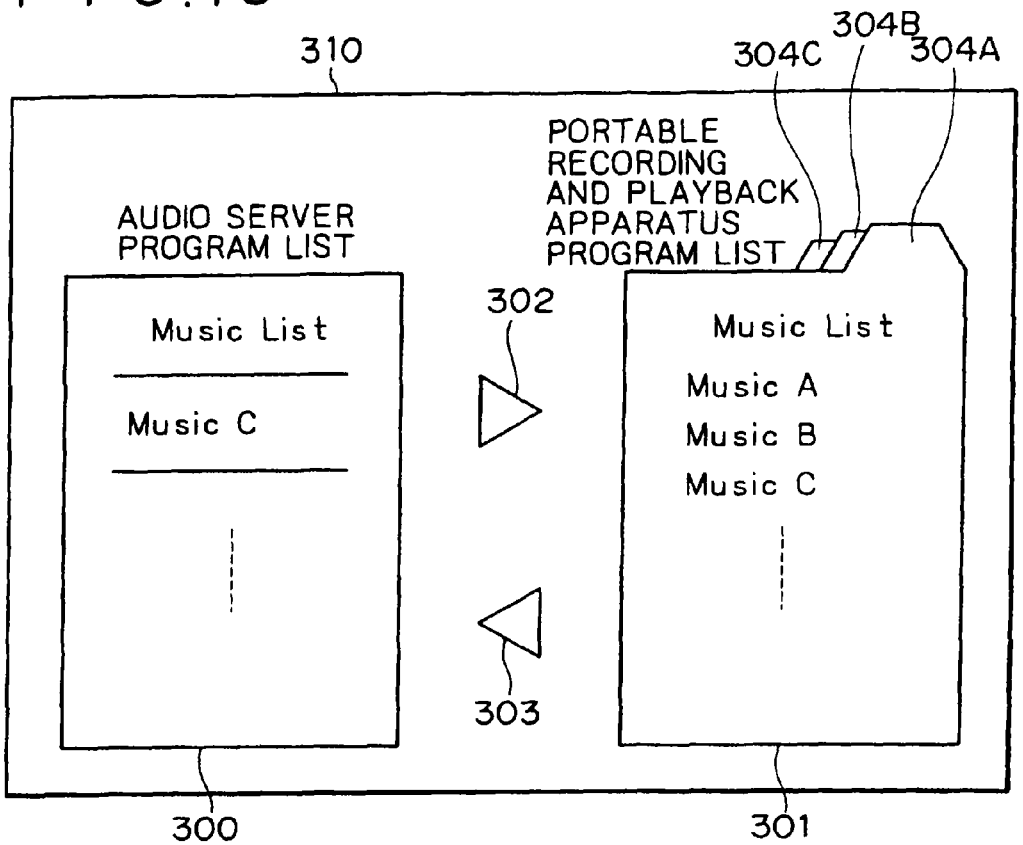
FIG. 10 is a diagram showing a typical edit screen for editing a transfer list in a simple and plain manner.

FIG. 10 is a diagram showing a typical edit screen for editing a transfer list. On the edit screen, a transfer list and a stock list are displayed as examples. To be more specific, a transfer-list edit screen 310 appears on the display unit 53 as shown in FIG. 10. The edit screen 310 includes list areas 300 and 301, which are each displayed as a window. In the list area 300, a stock list is displayed. The stock list is a list of pieces of musical data stored in the music server 50. In the list area 301, on the other hand, a transfer list to be edited is displayed. The transfer list is a list of pieces of musical data to be moved from the music server 50 to the portable recording and playback apparatus 70. What are actually put on the transfer and stock lists are titles of musical data.

Tri-angular buttons 302 and 303 oriented in directions opposite to each other are buttons for editing the transfer list displayed in the list area 301. To be more specific, the button 302 is used for adding a piece of musical data selected among those on the stock list displayed in the list area 300 to the transfer list appearing in the list area 301. On the other hand, the button 303 is used for deleting a piece of musical data selected among those on the transfer list displayed in the list area 301 from the transfer list.

As described above, the music server 50 may have a plurality of program lists corresponding to the each part of the apparatus 70. Thus, a plurality of transfer lists may exist. The edit screen 310 shown in FIG. 10 displays 3 transfer lists as an example. In this case, tabs 304A, 304B and 304C are displayed on the top of the list area 301 for the 3 transfer lists respectively. In the list area 301, a transfer list of a selected tab 304A, 304B or 304C is displayed. It is nice to display an ID of the apparatus 70 to be described later at a predetermined position in the list area 301. It should be noted that such an ID is not shown in the figure.

A variety of operations can be carried out on the input operation unit 1 shown in FIG. 2 for the edit screen 310. The display unit 53 will display information corresponding to an operation carried out on the input operation unit 1 on the edit screen 310. While looking at the edit screen 310 on the display unit 53, the user typically operates a variety of switches such as dial-type and push-type operation keys provided in the input operation unit 1 to specify a location on the edit screen 310 and to enter a command. Signals representing a variety of operations carried out on the input operation unit 1 are supplied to the CPU 8 by way of the bus 40.

As described above, the input operation unit 1 is directly provided on the server main body 51 shown in FIG. 2. It should be noted, however, that the information communication system is not limited to such a configuration. For example, an external operation unit 1' can be provided by connecting it to the server main body 51 by a wire as is the case with an embodiment shown in FIG. 11. To put it in detail, the input operation unit 1' is connected to the bus 40 of the server main body 51 either directly or indirectly through a predetermined interface. The input operation unit 1' includes a variety of operators for editing a transfer list displayed on the edit screen 310 and a transfer button for making a request for a transfer of pieces of musical data put on a transfer list from the music server 50 to the portable recording and playback apparatus 70.

Figure 11:
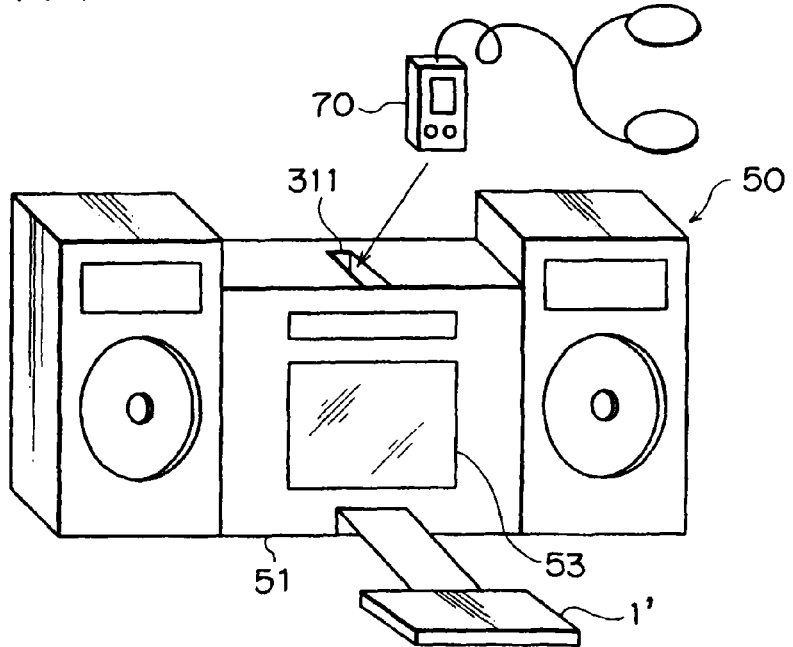
FIG. 11 is a diagram showing a typical external view of the music server in a simple and plain manner.

In addition, in the case of the embodiment shown in FIG. 11, the sever main body 51 has a mounting unit 311 for mounting the portable recording and playback apparatus 70. On the mounting unit 311, an interface 34 is provided. By mounting the portable recording and playback apparatus 70 on the mounting unit 311, the interface 35 employed in the portable recording and playback apparatus 70 is electrically connected to the interface 34 so that communication can be established between the portable recording and playback apparatus 70 and the music server 50. Thereby, musical data can be transferred from the music server 50 to the portable recording and playback apparatus 70.

FIGS. 12A and 12B are diagrams conceptually showing a typical management method for controlling a list of programs. Program lists are stored in a program file. A program file is typically stored in a predetermined area of the HDD 10 employed in the music server 50. The area is used for storing all program lists of the music server 50. A program file conceptually has a structure shown in FIG. 12A. As shown in the figure, program lists in a program file are distinguished from each other by assigning an ID to each of the program lists.

On the other hand, the portable recording and playback apparatus 70 also has a unique ID for distinguishing the portable recording and playback apparatus 70 individually from others. In the embodiment shown in FIG. 5, for example, this ID is stored in the ROM 104 in advance. Each program-list ID in the program file stored in the music server 50 is typically associated with the ID of a portable recording and playback apparatus 70 so that it is possible to create a list of programs applicable only to a specific portable recording and playback apparatus 70. In this case, the ID of a program list is the same as the ID assigned to the portable recording and playback apparatus 70 associated with the program list.

In the embodiment shown in FIG. 12, a program-list ID of 300 is assigned to a list of programs associated with a certain portable recording and playback apparatus 70. With such ID assignment, pieces of musical data on the list of programs having the list ID of 300 can be moved only to the portable recording and playback apparatus 70 with the same apparatus ID as the list ID.

By the same token, by using another program-list ID such as an ID of 301, it is possible to define a list of programs associated with a portable recording and playback apparatus 70 having the same apparatus ID as the program-list ID. In this way, the music server 50 can be provided with a plurality of program lists, which are each associated with a portable recording and playback apparatus 70 and can be distinguished from each other by assigning an ID to each of the program lists.

In addition, an ID assigned to a list of programs can be used for identifying the type of the program list.

In processing to edit a list of programs by using the screen edit 310, the list of programs to be edited is indicated by specifying an ID assigned to the list and the specified list is read out from the program file. The list of programs read out from the program file is stored in a predetermined area of typically the RAM 5 along with the program-list ID as shown in FIG. 12B. The CPU 8 controls an operation to display pieces of musical data on the list of programs stored in the RAM 5 in the list area 301 of the edit screen 310 as a transfer list. The user then edits the transfer list displayed on the screen edit 310. To be more specific, for example, the user adds a piece of musical data to the transfer list or deletes one from the list. The list of programs stored in the RAM 5 is updated in accordance with results of the editing operation.

Then, musical data is transferred from the music server 50 to the portable recording and playback apparatus 70 in accordance with the edited list of programs. Thus, the work to edit the list of programs to be referred to in transferring musical data can be done without regard to whether or not the portable recording and playback apparatus 70 has been mounted on or connected to the music server 50.

FIG. 13 shows a flowchart representing typical processing to edit a transfer list and to transfer musical data cataloged on the edited transfer list. As shown in the figure, the flowchart begins with a step S50 at which the work to edit the transfer list is started. Typically, the input operation unit 1' has a list edit button to be operated to request the music server 50 to carry out work to edit a transfer list. When this list edit button is pressed by the user, the HDD 10 is searched for a list management module.

Provided in a predetermined area at the beginning of the program file, the list management module is used for recording information on program lists. The CPU 8 reads out the information from the list management module to acquire a predetermined address of transfer list data in the HDD 10. The transfer list stored at the acquired address is then obtained by the CPU 8. Subsequently, display data based on the transfer list obtained by the CPU 8 is generated. The CPU 8 then supplies the display data to the LCD panel 26 employed in the display unit 53 by way of the LCD driver 25 to be displayed on the LCD panel 26.

In this way, the edit screen shown in FIG. 10 described above is displayed on the display unit 53 with the transfer list put in a state of being editable. The ID of a portable recording and playback apparatus 70 serving as a recipient of musical data to be transferred is entered. Such an ID is entered by specifying a desired one of the tabs 304A to 304C of the edit screen 310 shown in FIG. 10. In an example described below, a list of programs with an ID of 300 is selected.

At the next step S51, the program file stored in the HDD 10 is searched for a list of programs with an ID of 300 by the CPU 8. The flow of the processing then goes on to a step S52 to form a judgment as to whether or not the program file includes such a list of programs. If the program file does not include such a list of programs, the flow of the processing goes on to a step S53 at which a new list of programs with an ID of 300 is created in the program file stored in the HDD 10. After the new list of programs is created, the flow of the processing goes on to a step S54. If the program list includes such a list of programs, on the other hand, the flow of the processing goes on directly to the step S54. In this embodiment, when the program file does not include such a list of programs, a new list of programs is created in the program file stored in the HDD 10. However, it is also possible to adopt the following construction such that if the program list corresponding to the input ID of the apparatus 70 which can be transferred is created in advance in the HDD 10 of the music server 50, when the program list is not included in the program file as described above, transfer of the data may be prohibited as the CPU 8 makes a judgment that the transfer of the data to the apparatus 70 corresponding to the input ID is not permitted.

At the step S54, the list of programs with an ID of 300 is opened. To put it in more detail, the list of programs with an ID of 300 is read out with CPU 8 from the program file stored in the HDD 10 as shown in FIG. 12. The list of programs read out from the program file is stored into the RAM 5 to be read out later by the CPU 8. After reading out the list of programs, the CPU 8 controls an operation to display the edit screen 310 shown in FIG. 10 on the display unit 53, allowing the user to edit the transfer list.

Thus, in the list area 301 of the edit screen 310, the list of programs opened at the step S54 is displayed in the list area 301. If the list of programs was newly created, that is, if the list of programs contains no data, the transfer list displayed in the list area 301 is empty. In the list area 300, on the other hand, a table of pieces of musical data stored in the HDD 10 is displayed. As described earlier, this table is referred to as a stock list. It should be noted that, instead of displaying such a stock list, it is also possible to display a list of only pieces of musical data, which are obtained as a result of an operation to search all pieces of musical data stored in the HDD 10 for ones satisfying a predetermined condition.

As described above, the user appropriately operates the buttons 302 and 303 to transfer musical data from the list area 300 to the list area 301 and vice versa. In this way, pieces of musical data can be added to or deleted from the transfer list displayed in the list area 301. Or the user may select the musical data by using the mouse pointer and the like and may make a request for the addition or deletion of the pieces of musical data by so-called drag and drop operation using the mouse pointer between the list area 300 and the list area 301.

When the user finishes the work to edit the transfer list, the flow of the processing goes on to a step S56 to make a request for a transfer of musical data cataloged on the transfer list from the music server 50 to the portable recording and playback apparatus 70. The input operation unit 1' includes typically a transfer button for requesting the music server 50 to transfer pieces of musical data put on a transfer list. The user presses the transfer button to make a request for the transfer of the pieces of musical data put on the transfer list.

The flow of the processing then goes on to a step S57 to form a judgment as to whether or not the portable recording and playback apparatus 70 has been really mounted on the music server 50. If the portable recording and playback apparatus 70 has not been mounted on the music server 50, the flow of the processing goes on to a step S58 at which a warning is output to indicate that the portable recording and playback apparatus 70 has not been mounted on the music server 50. The flow of the processing then goes back to the step S57 to repeat the pieces of processing at the steps S57 and S58 till the portable recording and playback apparatus 70 is mounted. As the outcome of the judgment formed at the step S57 confirms that the portable recording and playback apparatus 70 has been mounted on the music server 50, the flow of the processing goes on to a step S59.

It should be noted that there are a variety of conceivable methods to form a judgment as to whether or not the portable recording and playback apparatus 70 has been really mounted on the music server 50. A typical method is explained below. For example, the portable recording and playback apparatus 70 is provided with a micro switch serving as hardware detection means for detecting the fact that the portable recording and playback apparatus 70 is mounted on the music server 50. When the portable recording and playback apparatus 70 is mounted on the music server 50, the detection means detects the fact that the portable recording and playback apparatus 70 is mounted on the music server 50, causing a predetermined pin of the interface 35 employed in the portable recording and playback apparatus 70 such as the 3rd pin, for example, to be set in an 'H' (high) state.

A pin of the interface 34 employed in the music server 50 serving as the counterpart of the predetermined pin of the interface 35 is connected to an interrupt pin of the CPU 8. When the predetermined pin of the interface 35 is set in an 'H' state, the CPU 8 is interrupted. The interrupt sets a predetermined bit of a register employed in the CPU 8 in an 'H' state, too. At the step S57, the CPU 8 detects the bit value of the register to form a judgment as to whether or not the portable recording and playback apparatus 70 has been really mounted on the music server 50. An 'H' state of the register bit indicates that the portable recording and playback apparatus 70 has been really mounted on the music server 50.

Refer back to the flowchart shown in FIG. 13. If the outcome of the judgment formed at the step S57 indicates the portable recording and playback apparatus 70 has been really mounted on the music server 50, the flow of the processing goes on to a step S59. At the step S59, the ID of the portable recording and playback apparatus 70 mounted on the music server 50 is checked to form a judgment as to whether or not the ID matches the ID of 300 input at the step S50 or the ID corresponds to the list area 301. The ID checked at this step is typically read out by the CPU 8 employed in the music server 50 from the ROM 104 of the portable recording and playback apparatus 70 through the interfaces 34 and 35.

If the ID of the portable recording and playback apparatus 70 does not match the ID input at the step S50, the flow of the processing goes on to a step S58 to output a warning indicating that the ID of the portable recording and playback apparatus 70 does not match the ID input at the step S50. If the ID of the portable recording and playback apparatus 70 matches the ID input at the step S50, on the other hand, the flow of the processing goes on to a step S60.

At the step S60, musical data put on the transfer list edited at the step S55 is moved from the music server 50 to the portable recording and playback apparatus 70. At that time, the transfer list showing the moved musical data can also be transferred from the music server 50 to the portable recording and playback apparatus 70 along with the musical data.

As described above, a transfer list unique to each portable recording and playback apparatus 70 can be created. A transfer of musical data to the portable recording and playback apparatus 70 is based on the transfer list unique to the portable recording and playback apparatus 70. A transfer list is kept in the music server 50. It is not until detection of the mounting of the portable recording and playback apparatus 70 on the music server 50 that musical data put on the transfer list is transferred to the portable recording and playback apparatus 70. Thus, a transfer list can be edited even if the portable recording and playback apparatus 70 is not mounted on the music server 50.

Let us consider a case in which musical data moved previously from the music server 50 is still stored in the HDD 106 of the portable recording and playback apparatus 70. As described above, in this embodiment, musical data moved from the music server 50 to the portable recording and playback apparatus 70 is put in status of being irreproducible in the music server 50 till the musical data is returned from the portable recording and playback apparatus 70 back to the music server 50.

Assume that musical data stored in the HDD 106 of the portable recording and playback apparatus 70 is overwritten by musical data newly received from the music server 50, or musical data previously stored in the HDD 106 of the portable recording and playback apparatus 70 is inadvertently erased in an operation to store musical data newly received from the music server 50 into the portable recording and playback apparatus 70. In this case, the overwritten or erased musical data transferred originally from the music server 50 can no longer be played back in the music server 50 and the portable recording and playback apparatus 70.

In a transfer of musical data put on a transfer list from the music server 50 to the portable recording and playback apparatus 70, the music server 50 acquires a list of musical data stored in the portable recording and playback apparatus 70 and for example the CPU 8 compares this list with the transfer list. If the result of the comparison indicates that a piece of musical data stored in the portable recording and playback apparatus 70 is different from pieces of musical data on the transfer list, the piece of musical data stored in the portable recording and playback apparatus 70 is examined by the CPU 8 to find out whether or not this piece of musical data stored in the portable recording and playback apparatus 70 has been returned to the music server 50 by checking the playback inhibit flag of the data in the program file. If the piece of musical data stored in the portable recording and playback apparatus 70 has not been returned to the music server 50, the CPU 8 issues a command to the portable recording and playback apparatus 70 to return the piece of data from the HDD 106 employed in the portable recording and playback apparatus 70 to the HDD 10 of the music server 50. CPU 5 is controlled to transfer the data from the HDD 106 to the HDD 10 in accordance with the request from the CPU 8. For example, under the control of the CPU 5, the management data of the data in question of the HDD 106 is deleted and at the same time, the data itself is stored by releasing, with CPU 8, the playback inhibit flag of the data.

It should be noted that, if there is a piece of musical data common to both the list in the portable recording and playback apparatus 70 and the transfer list in the music server 50, the transfer of the common piece of musical data can be omitted so that the time it takes to carry out the processing becomes shorter.

The CPU 8 of the music server 50 is capable of obtaining the list in the portable recording and playback apparatus 70 by issuing an instruction to the CPU 105 employed in the portable recording and playback apparatus 70 by way of the interfaces 34 and 35 to request the portable recording and playback apparatus 70 to transmit the list. In accordance with this instruction, the CPU 105 creates a list of musical data stored in the HDD 106 and supplies the created list to the CPU 8 of the music server 50 by way of the interfaces 34 and 35. Instead of comparison of the transfer list with the list in the portable recording and playback apparatus 70, a created transfer list is saved by the music server 50 and, when a new transfer list is created, the newly created transfer list is compared with the saved transfer list.

As described above, the portable recording and playback apparatus 70 serves as a destination of a transfer of musical data from the music server 50. It should be noted that the transfer destination is not limited to the portable recording and playback apparatus 70. For example, an optical disc or a magneto-optical disc having a diameter of about 64 mm can also be used as a transfer destination. Typically, the music server 50 is provided with a drive unit capable of recording and/or playing back data into and/or from an optical disc or a magneto-optical disc with a diameter of about 64 mm, which serves as a transfer destination. Pieces of musical data to be transferred to the optical disc or the magneto-optical disc with a diameter of about 64 mm can be selected in advance even if the optical disc or the magneto-optical disc with a diameter of about 64 mm has not been mounted on the drive unit yet. If an optical disc or a magneto-optical disc with a diameter of about 64 mm is used as a transfer destination, the ID checking described above can be omitted.

In the above description, the ATRAC method is adopted as a compression-encoding technique for carrying out a compression-encoding process on musical data recorded onto the HDD 10, the HDD 106 or the HDD 106a. It should be noted, however, that the compression-encoding technique is not limited to the ATRAC method. For example, a compression-encoding technique known as MPEG Audio Layer III (Moving Picture Experts Group Audio Layer III) or simply as MP3 can also be applied to the present invention.

As described above, in accordance with the present invention, there is exhibited an effect of an ability to transfer musical data cataloged on a transfer list from a music server to a portable recording and playback apparatus in a batch operation.

Moreover, the transfer list is kept in the music server and, it is not until detection of mounting of the portable recording and playback apparatus on the music server that the musical data cataloged on a transfer list is transferred from the music server to the portable recording and playback apparatus. For this reason, there is also exhibited an effect of an ability to edit the transfer list even if the portable recording and playback apparatus is not mounted on the musical server.

In addition, since the transfer list is edited by using an edit screen, there is also exhibited an effect of elimination of confusion due to the fact that the present list editing purpose is no longer known.

Furthermore, since a program list used in moving musical data from the music server to the portable recording and playback apparatus must be a transfer list, there is also exhibited an effect of, for example, prevention of a program list created for organizing pieces of music data stored in the music server from being used inadvertently in transferring pieces of musical data in a batch operation due to carelessness.

What is claimed is:

1. A transmission apparatus comprising:
    a communication unit configured to transmit to an external apparatus identification information of content data stored in the transmission apparatus and to receive additional information associated with the content data from the external apparatus;
    a searching unit configured to search content data from said transmission apparatus based on a comparison between the additional information received from the external apparatus and a search term;
    a display unit configured to display a first list indicating content data matching the search term;
    an editing unit configured to edit a second list of content data based on the first list, said second list registering a plurality of content data; and
    a transmission unit configured to transmit a plurality of content data to a reproduction apparatus based on the edited second list,
    wherein the display unit displays a warning that the reproduction apparatus is not connected to the transmission apparatus if the reproduction apparatus is not connected to the transmission apparatus.

2. The transmission apparatus according to claim 1, further comprising:
    a comparison unit configured to compare an identifier of said reproduction apparatus with an identifier stored in said transmission apparatus, wherein said transmission unit transmits said content data registered in said second list to said reproduction apparatus when said identifiers match each other.

3. The transmission apparatus according to claim 1, wherein said comparison unit compares said second list and a list of content data stored in said reproduction apparatus, and said transmission unit transmits content data which is registered in said second list and is not stored in said reproduction apparatus to said reproduction apparatus.

4. The transmission apparatus according to claim 3, further comprising:
    a deletion unit configured to delete from said reproduction apparatus content data which is not registered in said second list and is stored in said reproduction apparatus.

5. The transmission apparatus according to claim 1, wherein said editing unit is configured to edit the second list based on a user input before the content data is transmitted by the transmission unit.

6. The transmission apparatus according to claim 5, wherein said display unit displays the first list in a first window and said second list in a second window, and said user input is a drag and drop operation between said first window and said second window.

7. The transmission apparatus according to claim 6, wherein said display unit displays said first window at a left side of the display unit and said second window at a right side of the display unit.

8. The transmission apparatus according to claim 5, further comprising:
    a touch sensor configured to receive said user input.

9. The transmission apparatus according to claim 1, wherein said second list is associated with said identifier of the reproduction apparatus.

10. The transmission apparatus according to claim 2, wherein said comparison unit extracts one list from a plurality of lists as said second list, and said second list is associated with the same identifier as said identifier of said reproduction apparatus.

11. The transmission apparatus according to claim 1, wherein said transmission unit transmits said second list to said reproduction apparatus with the content data.

12. The transmission apparatus according to claim 1, wherein said transmission unit omits transmission to said reproduction apparatus of content data which is included in said second list.

13. The transmission apparatus according to claim 1, wherein said transmission unit charges a battery of said reproduction apparatus in parallel with said transmission.

14. The transmission apparatus according to claim 1, further comprising:
    a ripping unit configured to rip content data from a CD into said transmission apparatus.

15. The transmission apparatus according to claim 1, wherein said content data is made by compression-encoding technology.

16. The transmission apparatus according to claim 1, wherein said first list or said second list includes at least one of a title, an artist, a composer, a lyricist, a lyric, and a jacket image of content data.

17. The transmission apparatus according to claim 16, further comprising:
    a communication unit configured to obtain at least one of said title, said artist, said composer, said lyricist, said lyric, and said jacket image of content data from an external server via an internet.

18. The transmission apparatus according to claim 1, wherein said transmission unit is wireless transmission unit.

19. The transmission apparatus according to claim 1, wherein said reproduction apparatus is portable.

20. A transmission method comprising:
    transmitting to an external apparatus identification information of content data stored in a transmission apparatus;
    receiving additional information associated with the content data from the external apparatus;
    searching content data from said transmission apparatus based on a comparison between the additional information received from the external apparatus and a search term;
    displaying a first list indicating content data matching the search term on a display unit;
    editing a second list of content data based on the first list, said second list registering a plurality of content data;
    transmitting a plurality of content data to a reproduction apparatus based on the edited second list; and
    displaying a warning that the reproduction apparatus is not connected to the transmission apparatus if the reproduction apparatus is not connected to the transmission apparatus.

21. The transmission method according to claim 20, further comprising:
    comparing an identifier of said reproduction apparatus with an identifier stored in said transmission apparatus; and
    transmitting said content data registered in said second list to said reproduction apparatus when said identifiers match each other.

22. The transmission method according to claim 20, further comprising: comparing said second list and a list of content data stored in said reproduction apparatus; and transmitting content data which is registered in said second list and is not stored in said reproduction apparatus to said reproduction apparatus.

23. The transmission method according to claim 22, further comprising:
deleting from said reproduction apparatus content data which is not registered in said second list and is stored in said reproduction apparatus.

24. The transmission method according to claim 20, further comprising:
editing the second list based on a user input before the content data is transmitted.

25. The transmission method according to claim 24, further comprising:
displaying the first list in a first window and said second list in a second window; and
dragging and dropping the first list from said first window to said second window to edit the second list.

26. The transmission method according to claim 25, further comprising:
displaying said first window at a left side of the display unit and said second window at a right side of the display unit.

27. The transmission method according to claim 24, further comprising:
receiving said user input through a touch sensor.

28. The transmission method according to claim 20, wherein said second list is associated with said identifier of the reproduction apparatus.

29. The transmission method according to claim 21, further comprising:
extracting one list from a plurality of lists as said second list; and
associating said second list with the same identifier as said identifier of said reproduction apparatus.

30. The transmission method according to claim 20, further comprising:
transmitting said second list to said reproduction apparatus with the content data.

31. The transmission method according to claim 20, further comprising:
omitting transmission to said reproduction apparatus of content data which is included in said second list.

32. The transmission method according to claim 20, further comprising:
charging a battery of said reproduction apparatus in parallel with said transmitting.

33. The transmission method according to claim 20, further comprising:
ripping content data from a CD.

34. The transmission method according to claim 20, wherein said content data is made by compression-encoding technology.

35. The transmission method according to claim 20, wherein said first list or said second list includes at least one of a title, an artist, a composer, a lyricist, a lyric, and a jacket image of content data.

36. The transmission method according to claim 35, further comprising:
obtaining at least one of said title, said artist, said composer, said lyricist, said lyric, and said jacket image of content data from an external server via an internet.

37. The transmission method according to claim 20, wherein said transmitting is performed with a wireless transmission unit.

38. The transmission method according to claim 20, wherein said reproduction apparatus is portable.

39. A non-transitory computer readable medium including computer executable instructions, wherein the instructions, when executed by a processor, cause the processor to perform a transmission method comprising:
transmitting to an external apparatus identification information of content data stored in a transmission apparatus;
receiving additional information associated with the content data from the external apparatus;
searching content data from said transmission apparatus based on a comparison between the additional information received from the external apparatus and a search term;
displaying a first list indicating content data matching the search term on a display unit;
editing a second list of content data based on the first list, said second list registering a plurality of content data;
transmitting a plurality of content data to a reproduction apparatus based on the edited second list; and
displaying a warning that the reproduction apparatus is not connected to the transmission apparatus if the reproduction apparatus is not connected to the transmission apparatus.

40. The computer readable medium according to claim 39, the method further comprising:
comparing an identifier of said reproduction apparatus with an identifier stored in said transmission apparatus; and
transmitting said content data registered in said second list to said reproduction apparatus when said identifiers match each other.

41. The computer readable medium according to claim 39, the method further comprising:
comparing said second list and a list of content data stored in said reproduction apparatus; and
transmitting content data which is registered in said second list and is not stored in said reproduction apparatus to said reproduction apparatus.

42. The computer readable medium according to claim 41, the method further comprising:
deleting from said reproduction apparatus content data which is not registered in said second list and is stored in said reproduction apparatus.

43. The computer readable medium according to claim 39, the method further comprising:
editing the second list based on a user input before the content data is transmitted.

44. The computer readable medium according to claim 43, the method further comprising:
displaying the first list in a first window and said second list in a second window; and
dragging and dropping the first list from said first window to said second window to edit the second list.

45. The computer readable medium according to claim 44, the method further comprising:
displaying said first window at a left side of the display unit and said second window at a right side of the display unit.

46. The computer readable medium according to claim 43, the method further comprising:
receiving said user input through a touch sensor.

47. The computer readable medium according to claim 39, wherein said second list is associated with said identifier of the reproduction apparatus.

48. The computer readable medium according to claim 40, the method further comprising:
   extracting one list from a plurality of lists as said second list; and
   associating said second list with the same identifier as said identifier of said reproduction apparatus.

49. The computer readable medium according to claim 39, the method further comprising: transmitting said second list to said reproduction apparatus with the content data.

50. The computer readable medium according to claim 39, the method further comprising:
   omitting transmission to said reproduction apparatus of content data which is included in said second list.

51. The computer readable medium according to claim 39, the method further comprising:
   charging a battery of said reproduction apparatus in parallel with said transmitting.

52. The computer readable medium according to claim 39, the method further comprising:
   ripping content data from a CD.

53. The computer readable medium according to claim 39, wherein said content data is made by compression-encoding technology.

54. The computer readable medium according to claim 39, wherein said first list or said second list includes at least one of a title, an artist, a composer, a lyricist, a lyric, and a jacket image of content data.

55. The computer readable medium according to claim 54 the method further comprising:
   obtaining at least one of said title, said artist, said composer, said lyricist, said lyric, and said jacket image of content data from an external server via an internet.

56. The computer readable medium according to claim 39, wherein said transmitting is performed with a wireless transmission unit.

57. The computer readable medium according to claim 39, wherein said reproduction apparatus is portable.

58. A transmission system comprising:
   a reproduction apparatus including a reproducer configured to store and reproduce content data; and
   a transmission apparatus including,
      a communication unit configured to transmit to an external apparatus identification information of content data stored in the transmission apparatus and to receive additional information associated with the content data from the external apparatus;
      a searching unit configured to search content data from said transmission apparatus based on a comparison between the additional information received from the external apparatus and a search term;
      a display unit configured to display a first list indicating content data matching the search term;
      an editing unit configured to edit a second list of content data based on the first list, said second list registering a plurality of content data; and
      a transmission unit configured to transmit a plurality of content data to the reproduction apparatus based on the edited second list,
      wherein the display unit displays a warning that the reproduction apparatus is not connected to the transmission apparatus if the reproduction apparatus is not connected to the transmission apparatus.

59. The transmission apparatus according to claim 1, wherein the additional information includes lyrics of each content data.

60. The transmission apparatus according to claim 1, wherein the additional information includes a musical composer of each content data.

61. The transmission method according to claim 20, wherein the additional information includes lyrics of each content data.

62. The computer readable medium according to claim 39, wherein the additional information includes lyrics of each content data.

63. The transmission system according to claim 58, wherein the additional information includes lyrics of each content data.

* * * * *